(12) United States Patent
Jaeger et al.

(10) Patent No.: US 6,642,919 B1
(45) Date of Patent: Nov. 4, 2003

(54) INTEGRATED ELECTRICAL CONTROLS AND GRAPHICS DISPLAY SCREENS

(75) Inventors: Denny Jaeger, Oakland, CA (US); Kenneth M. Twain, Oakland, CA (US)

(73) Assignee: Intertactile Technologies Corporation, Oakland, CA (US)

( * ) Notice: Subject to any disclaimer, the term of this patent is extended or adjusted under 35 U.S.C. 154(b) by 0 days.

(21) Appl. No.: 09/551,484

(22) Filed: Apr. 18, 2000

(51) Int. Cl.[7] .............................. G09G 5/00; G09G 5/08
(52) U.S. Cl. ..................... 345/161; 345/156; 345/177; 345/204; 345/1.2; 345/2.3; 345/31; 455/3.01; 455/24; 455/426.2
(58) Field of Search .............................. 345/179–184, 345/156, 60, 173–174, 629, 630, 641, 659, 649–651, 661, 662, 676, 677, 833, 161, 176, 177, 178, 204, 205, 206, 214, 1.2, 2.3, 4, 7, 31, 80; 178/19.01, 19.05, 18.01; 455/296, 307, 3.01, 3.05, 426.2, 14, 15, 24, 39, 73, 78, 88, 91, 130; 348/189

(56) References Cited

U.S. PATENT DOCUMENTS

| 5,572,239 A | 11/1996 | Jaeger ........................ 345/172 |
| 5,712,661 A | 1/1998 | Jaeger ........................ 345/170 |
| 5,774,115 A | 6/1998 | Jaeger et al. ................ 345/172 |
| 5,777,603 A | * 7/1998 | Jaeger ........................ 345/172 |
| 5,786,811 A | 7/1998 | Jaeger ........................ 345/172 |
| 5,805,145 A | 9/1998 | Jaeger ........................ 345/172 |
| 5,805,146 A | 9/1998 | Jaeger et al. ................ 345/172 |
| 5,841,428 A | * 11/1998 | Jaeger et al. ................ 345/184 |
| 5,867,149 A | 2/1999 | Jaeger ........................ 345/172 |
| 5,936,613 A | 8/1999 | Jaeger et al. ................ 345/172 |
| 5,977,955 A | 11/1999 | Jaeger ........................ 345/172 |
| 5,982,355 A | 11/1999 | Jaeger et al. ................ 345/161 |
| 6,326,956 B1 | * 12/2001 | Jaeger ........................ 345/179 |
| 6,360,090 B1 | * 3/2002 | Holcombe et al. .......... 455/307 |

FOREIGN PATENT DOCUMENTS

GB          2230367 A     * 10/1990    ........... G08C/23/00

* cited by examiner

Primary Examiner—Matthew C. Bella
Assistant Examiner—Wesner Sajous
(74) Attorney, Agent, or Firm—Harris Zimmerman

(57) ABSTRACT

One or more controls producing control signals for electrical apparatus are disposed at the face of an electronic display screen which display graphics pertinent to the operation of the controls. Controls having a cap which is slidable along a track include a tongue in the track connecting with signal producing components at an off screen location thereby enabling use of a track of minimal bulk. Controls having slidable caps or turnable knobs and controls such as joysticks and switches snap engage at the face of the screen enabling easy replacement and movement to different locations on the screen. Control signals may be transmitted to an off screen location without use of conductors extending along the screen.

57 Claims, 23 Drawing Sheets

FIG. 30
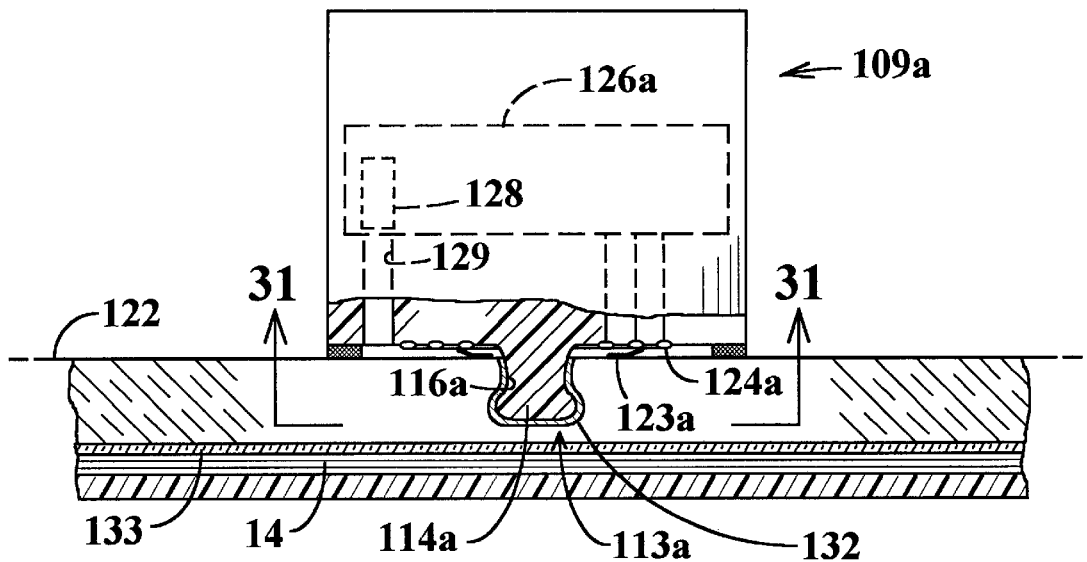
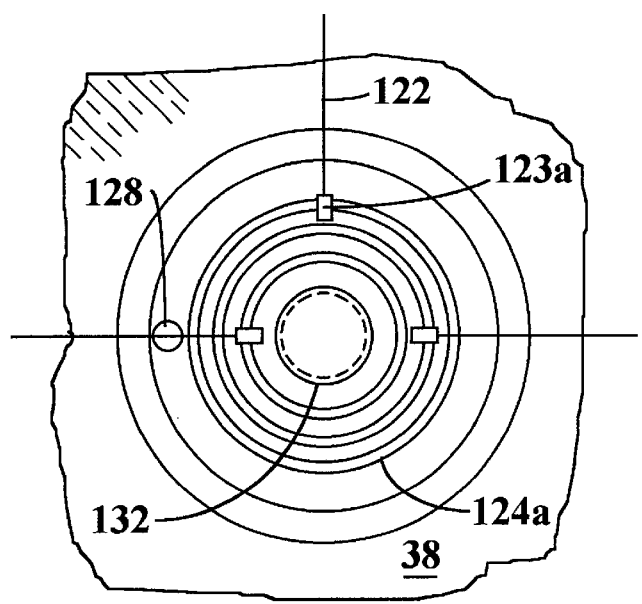
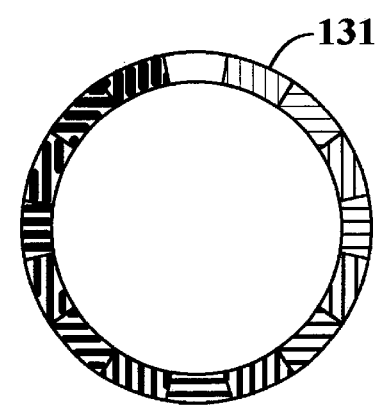
FIG. 31
FIG. 32

FIG. 35
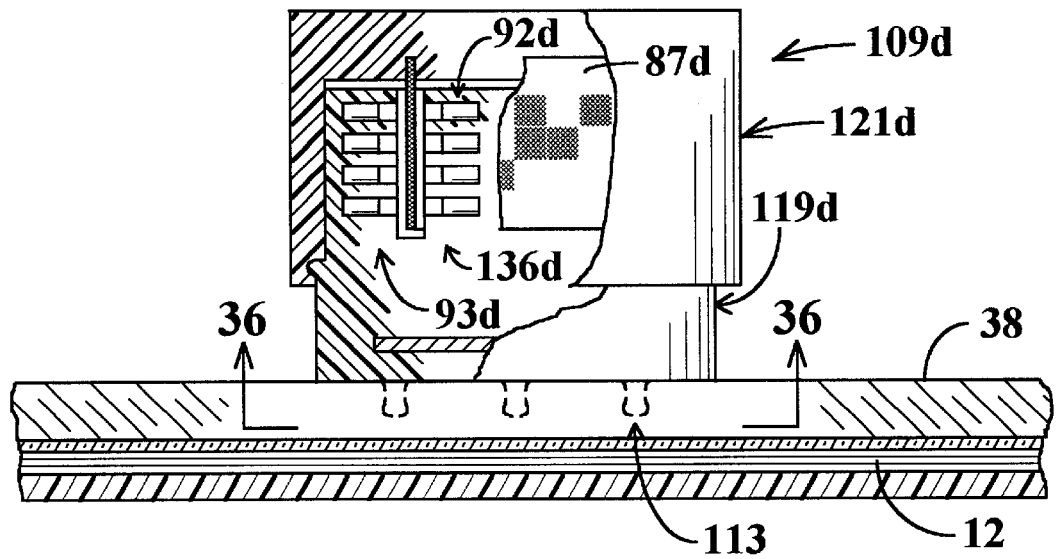
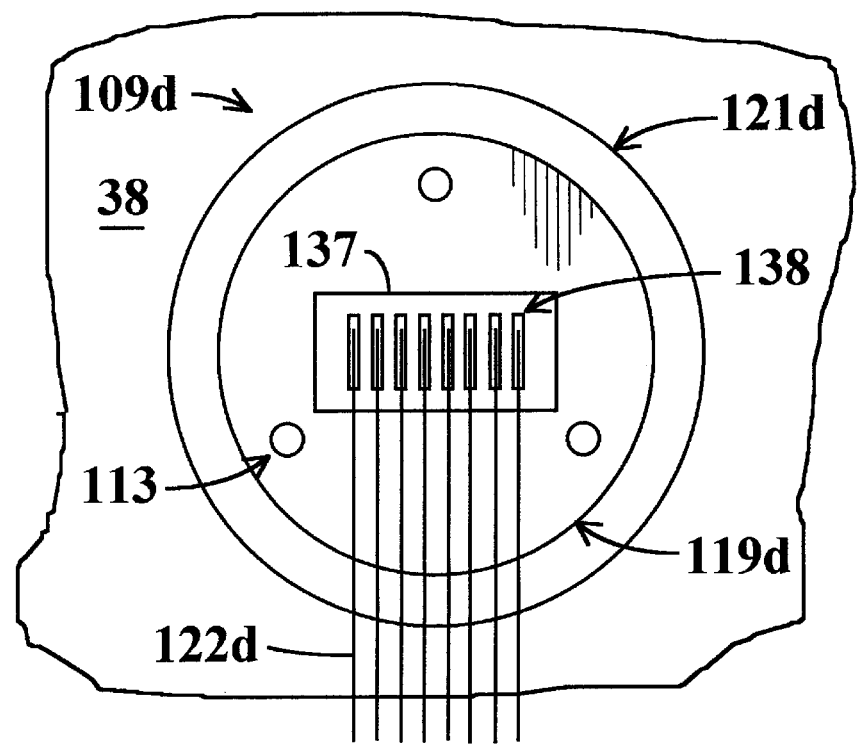
FIG. 36

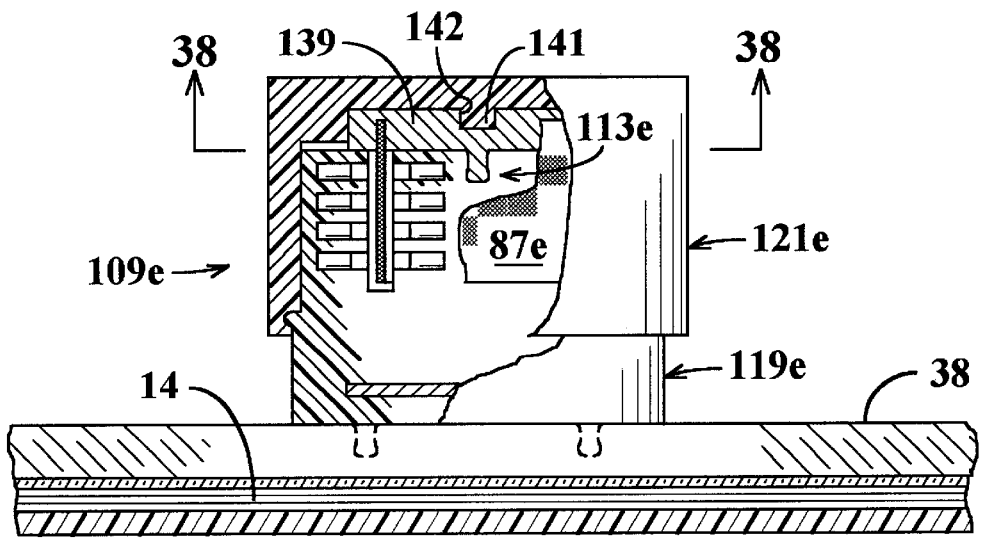
FIG. 37
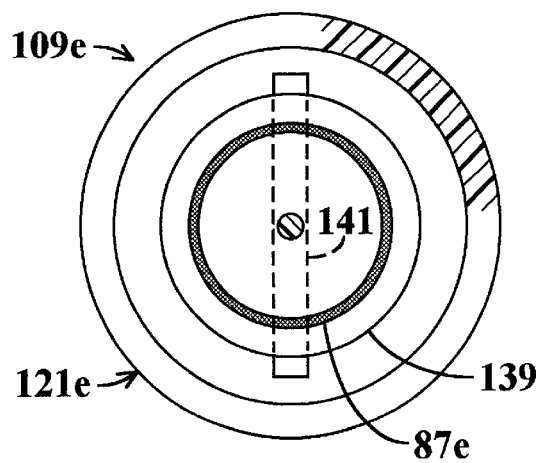 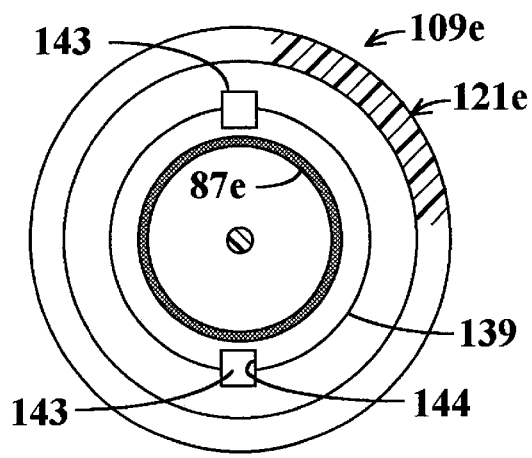
FIG. 38  FIG. 39

INTEGRATED ELECTRICAL CONTROLS AND GRAPHICS DISPLAY SCREENS

TECHNICAL FIELD

This invention relates to devices for controlling electrical apparatus and more particularly to devices of his kind which are disposed at the face of an electronic display screen which displays changeable information pertinent to operation of the control device.

BACKGROUND OF THE INVENTION

Electrical control devices such as switches, potentiometers, faders, joysticks and the like typically require graphics which mark the settings of the control and/or which convey other information useful to the operator of the device. Traditionally such graphics have been permanent markings imprinted at locations adjacent, to or near the operator manipulated member of the control device. This may not provide the operator with all of the information that might be useful as only a limited amount of space is available for the permanent markings. Unchangeable imprinted graphics also cause difficulties in the case of a multi-purpose control device which serves different purposes during different modes of operation of the controlled apparatus. Graphics which are appropriate for one mode of operation may be irrelevant to another mode of operation.

These problems have heretofore been addressed by disposing electrical control devices in front of an electronic display screen. The screen can display changing graphics which convey more information than is possible with a single set of permanently imprinted markings and/or which change when the control device is used to control different modes of operation of an electrical apparatus. Prior U.S. Pat. No. 5,572,239; U.S. Pat. No. 5,805,146 and U.S. Pat. No. 5,936,613 disclose examples of control devices having integrated display screens of this kind.

Control devices of this type have a movable member, such as a turnable or slidable knob or cap, a switch button or a joystick for example, that is manipulated by the operator to change the setting of the control. The operator's manipulations of the movable member are detected by motion sensing means which then transmit an appropriate control signal to the controlled apparatus. The motion sensing means may be of a variety of different types. The motion sensing means may variously include rotary or linear potentiometers or variable resistances, photoelectric motion sensors or magnetic sensors which utilize the Hall effect, among other examples.

Controls of the fader or linear potentiometer type have a movable cap which is slid along a linear path to vary a control signal. In traditional controls of this type which have permanently imprinted graphics the movable cap is mounted on a stem which extends into the underlying control panel or the like through a thin slot. Components which produce a control signal in response to movement of the cap are situated behind the panel. It is possible to provide a thin slot in an electronic display screen, where the control is to be disposed at the face of such a screen, but this requires that the screen have a specialized internal construction which can increase manufacturing cost. This can be avoided by providing a track at the front of the display screen which supports the movable cap and stem. Heretofore, electronic components which detect movement of the cap and which produce the variable, control signal in response to such movement have been disposed within the track. Inclusion of such components requires that the track be bulkier than would otherwise be the case. It is more comfortable to operators of the control and more attractive if the track is of minimal size and as unobtrusive as possible.

The present invention is directed to overcoming one or more of the problems discussed above.

SUMMARY OF THE INVENTION

In a first aspect this invention provides a control, device for producing control signals for electrical apparatus. The control device has a movable member that is slidable along a track and has control signal producing components which vary the control signal in response to movement of the movable member. The movable member and track are disposed at least in part at the face of an electronic display screen which displays pertinent to operation of the control device. At least a portion of the control signal producing components are at an off screen location which is away from the face of the display screen. The movable member is linked to the control signal producing components by a slidable tongue which extends along the track from the movable member to the off screen location.

In another aspect of the invention, a control device for producing control signals for electrical apparatus is disposed in front of the image display area of an electronic display screen that displays graphics pertinent to operation of the control device, the control device being fastened to the display screen by a snap, engagement.

In another aspect of the invention, a control device for producing control signals for electrical apparatus is disposed in front of the image display area of an electronic display screen that displays graphics pertinent to operation of the control device The control device has a linear track which extends along the display screen and a cap which is slidable along the track to vary the electrical control signal. The cap is supported by a support post which travels along the track with the cap, the cap being fastened to the support post by a disengageable snap engagement.

In another aspect of the invention a control device for producing control signals for electrical apparatus is disposed in front of the image display area of an electronic display screen that displays graphics pertinent to operation of the control device. The control device has a base portion affixed to the display screen at the image display area thereof. The device further includes a carrier plate disposed within the base portion and a knob which is turnable relative to the base portion, the turnable knob being fastened to the carrier plate by a snap engagement.

In another aspect of the invention, a control device for producing control signals for electrical apparatus has a fixed base and a component which is turned by a knob to vary a control signal. Rotary motion of the knob is transferred to the component by a turnable intermediate member which is constrained to rotate with the knob and which rotates the component. The knob is disengageable from the base member and the intermediate member to enable replacement of the knob with another knob.

In another aspect of the invention a control device for producing control signals for electrical apparatus is disposed at the front of an electronic image display screen which displays changeable graphics that are pertinent to operation of the control device. The control device has a fixed base and a knob thereon which is turned about an axis of rotation that extends at right angles to the display screen to vary,an electrical control signal. The control device further has a cylindrical member disposed in coaxial relationship with the axis of rotation and which turns about the axis of rotation with the knob. The cylindrical member has angular position identifying coding thereon. At least one coding sensor is positioned to read successive portions of the coding as the cylindrical member turns about the axis of rotation.

In another aspect of the invention a control device for an electrical circuit has a knob which is turnable to any of a plurality of different angular orientations to change an electrical condition in the circuit. The knob is disposed in front of an electronic image display device which has an image display area at which changeable images are displayed and at least a portion of the knob at a location which overlays the image display area of the image display device. A control signal producing circuit at that location produces an electrical signal that varies in response to turning of the knob. An infrared transmitter in the control device transmits the signal in the form of modulated infrared energy. A signal receiving circuit situated away from the image display area of the image display device includes an infrared receiver which converts the infrared signal back into an electrical signal.

In another aspect of the invention a control device for an electrical circuit has a knob which is turnable to any of a of a plurality different angular orientations to change an electrical condition in the circuit. The knob is disposed in front of an electronic image display device which has an image display area at which changeable images are displayed and at least a portion of the knob is at a location which overlays the image display area of the image display device. A control signal producing circuit at that location produces an electrical signal that varies in response to turning of the knob. An ultrasonic transmitter in the control device transmits the signal in ultrasonic form. A signal receiving circuit situated away from the image display area of the image display device includes an ultrasonic receiver which converts the ultrasonic signal back into an electrical signal.

In another aspect of the invention a control device for an electrical circuit has a cap which is slidable along a track to any of a plurality of different positions to change an electrical condition in the circuit. The cap and track are disposed in front of an electronic image display device which has an image display area act which changeable images are displayed. At least portions of the cap and track overlay the image display area of the image display device. A signal producing circuit is disposed within at least one of the cap and the track and produces an electrical signal that varies in response to movement of the cap along the track. A signal transmitter transmits the signal outward from the control device. A receiving circuit situated away from the image display area of the image display device converts the transmitted signal back into an electrical signal.

In another aspect of the invention a control device for an electrical circuit is a joystick having a member which is deflectable in lateral directions to change an electrical condition in the circuit. The joystick is disposed in front of an electronic image display device which has an image display area at which changeable images are displayed. At least a portion of the joystick overlays the image display area of the image display device. A signal producing circuit within the joystick produces an electrical signal that varies in response to deflections of the deflectable member. A signal transmitter transmits the signal outward from the joystick. A signal receiving circuit situated away from the image display area of the image display device converts the transmitted signal back into an electrical signal.

In one aspects the invention provides an improved control device of the kind in which a member is slidable along a track to vary a control signal and wherein the track is at the face of an electronic display screen which can display changeable graphics pertaining operation of the control. A slidable tongue extends along the track to link the slidable member with control signal producing electronic components which are at a location that is away from the face of the screen. The track may then be desirably compact and unobtrusive to the operator as some or all of the electronic components are not contained within the track. In another aspect the invention enables easy replacement of control devices and components of the devices at a display screen and movement of the devices between different locations by use of snap engagements. In another aspect the invention provides an improved construction for control devices at a display screen which have rotatable coded elements for sensing the angular orientation of a turnable member. In still another aspect the invention, control signals produced by a control device at the face of a display screen are transmitted to an off screen location without the use of electrical conductors on the screen.

The invention, together with further aspects and advantages thereof, may be further understood by reference to the following description of the preferred embodiments and by reference to the accompanying drawings.

BRIEF DESCRIPTION OF THE DRAWINGS

FIG. 30 is aside view, partially in section, of a second circuit control device which snap engages at the face of an electronic display screen.

FIG. 31 is a view of the underside of the circuit control device of FIG. 30 taken along line 31—31 thereof.

FIG. 32 diagramatically depicts a light pattern displayed by the display screen of FIGS. 30 and 31 and which enables photo-optical sensing means in the control device to vary a control signal as a function of the angular orientation of the control device.

FIG. 35 is a side view, partially in section, of a fifth circuit control device which snap engages at the face of an electronic display screen.

FIG. 36 is a view of the underside of the circuit control device of FIG. 35 taken along line 36—36 thereof.

FIG. 37 is a side view, partially in section, of a sixth circuit control device which snap engages at the face of an electronic display screen.

FIG. 38 is a section view taken along line 38—38 of FIG. 37.

FIG. 39 is a section view corresponding generally to FIG. 38 while illustrating a variation of the control device thereof.

DETAILED DESCRIPTION OF THE PREFERRED EMBODIMENTS

Figure 1:
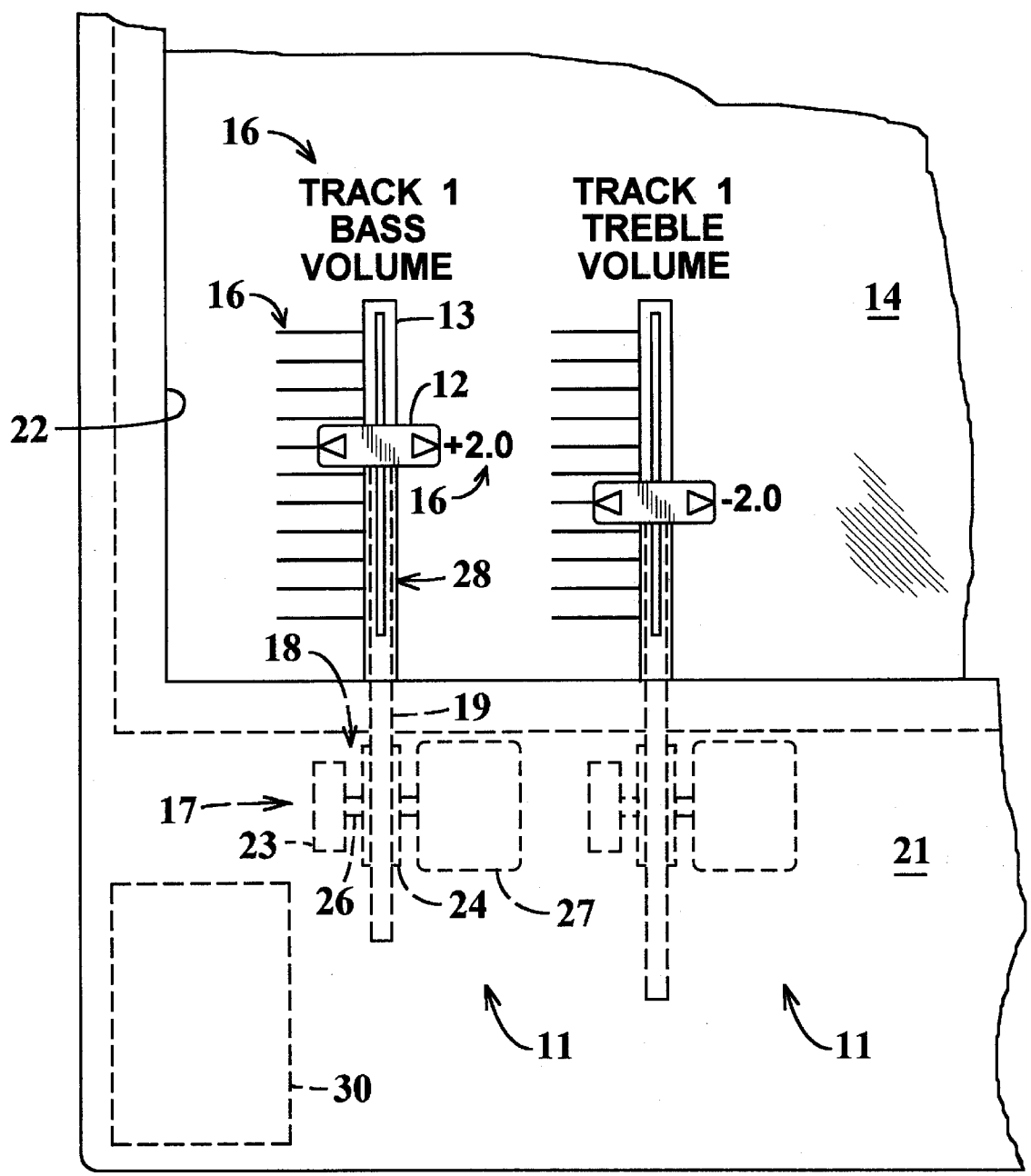
FIG. 1 is a front view of a control panel having control devices of the slidable cap type disposed at the face of an electronic display screen which provides changeable graphics, pertinent to operation of the controls.

Referring initially to FIG. 1 of the drawings, a first aspect of the invention provides control devices 11 of the type in which a cap or other movable member 12 is slidable along a track 13 to vary an electrical control signal. In control devices 11 which embody the invention, the movable member 12 and at least a portion of the track 13 are disposed at the face of an electronic display screen 14 which displays graphics 16, such as labels, setting markings or icons for example, that are pertinent to the operation of the control device. The screen 14 is of the flat panel display type in this example although other display screens, such as cathode ray tube screens, can also be used.

Figure 2:
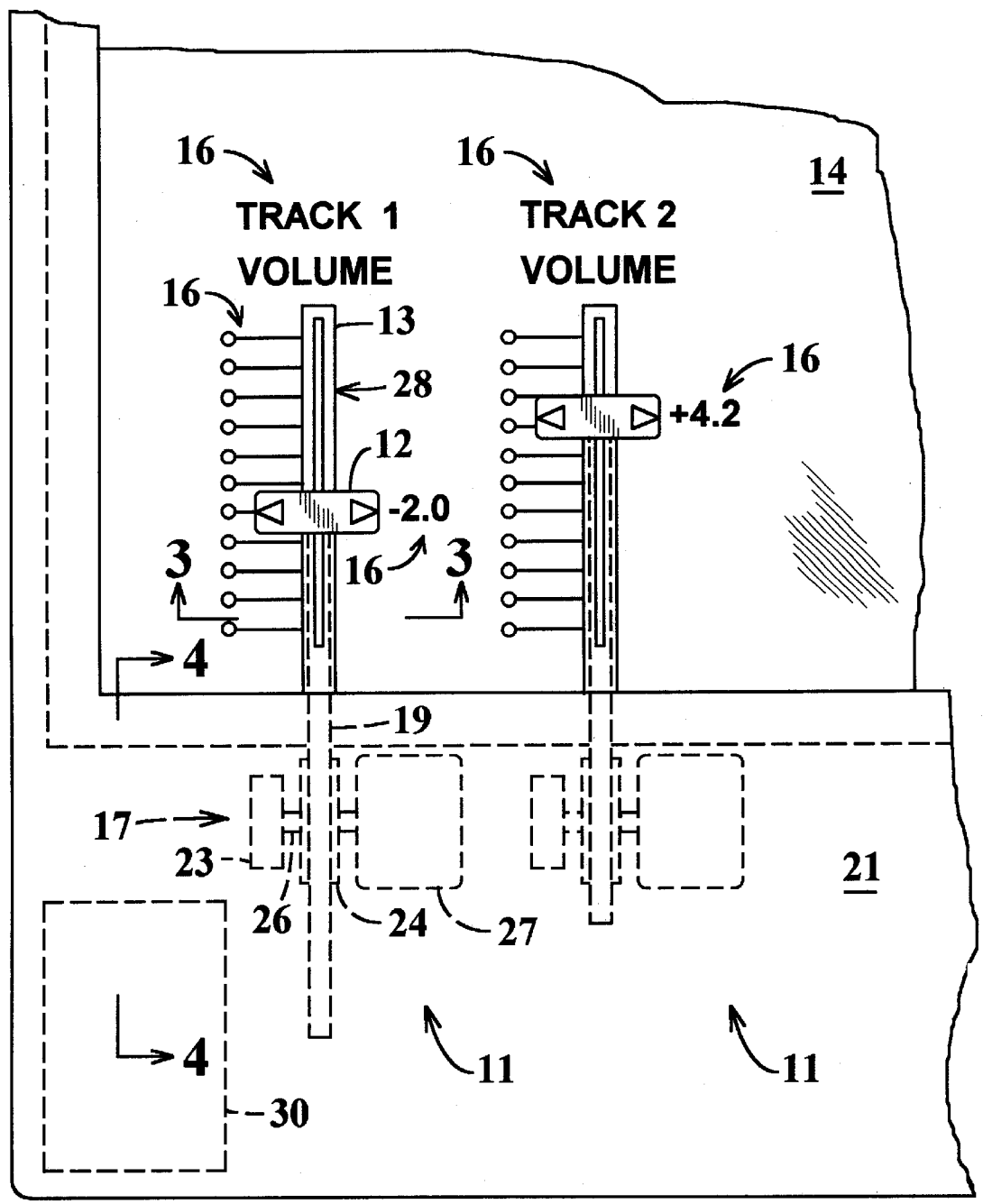
FIG.2 is another front view of the control panel of FIG. 1 showing changed graphics which are displayed during a second mode of operation of the control device.

Disposition of the movable member 12 and track 13 at the face of the screen 14 enables graphics 16 to be displayed at locations which are adjacent to or very close to those components when that is desirable. As shown in FIG. 2, the graphics 16 may change during different stages of operation of the control device 11 such as where the same control device is used to control more than one function of the controlled apparatus.

FIGS. 1 and 2 show two of the control devices 11 as they might be employed at the control panel of a digital sound processing system for such purposes as adjusting the audio volume of a series of sound tracks. It should be recognized that this is strictly for purposes of example. Similar control devices 11 may be used to control diverse different types of electrical apparatus which require variable control signals in analog or digital form.

Control devices 11 of this kind include control signal producing means 17 for producing the control signal in electrical form and for varying the signal in response to movement of the movable member 12. Disposition of electronic and mechanical components of the control signal producing means 17 within the track 13 itself can result in a bulkier track than is preferable for many purposes. Operators of older control systems which have faders or other slidable cap type of controls are accustomed to nothing more than a thin slot beneath the slidable cap. The present invention allows the track 13 to be more compact and less obtrusive by situating some or all of the components of the control signal producing means 17 at an off screen location 18. The movable member 12 is linked to the off screen components by an elongated slidable tongue 19 which extends along the track 13 and outward from an edge of the display screen 14.

The display screen 14 of this example is situated within a housing 21 and the image display area of the screen is viewable through a window 22 in the housing. The control signal producing means 17 are situated within a portion of the housing 21 that is sufficiently extensive to accommodate to the outward travel of tongue 19 from the edge of display screen 14. The tongue 19 of this embodiment is formed of rigid material. In an alternate embodiment to be hereinafter described the tongue is flexible and enables a reduction in the size of the housing 21.

The control signal producing means 17 includes a signal varying component 23, which is a rotary potentiometer in this example, that outputs an electrical signal that is varied by turning of a rotary gear 24 which is coupled to the potentiometer by a shaft 26. Sliding movement of the tongue 19 turns the gear 24. The control devices 11 of this example are of the motorized fader type in which an electrical motor 27 is coupled to shaft 26. Fader motors 27 of the known kind can, reproduce a sequence of movements of the movable member 12 that is initially established by manual manipulation of the member. The motor 27 is an optional component that is not needed in many uses of the control devices 11.

Electronic circuits to be hereinafter described which are associated with the control devices 11 can be situated on one or more circuit boards 30 situated within housing 21.

Figure 3:
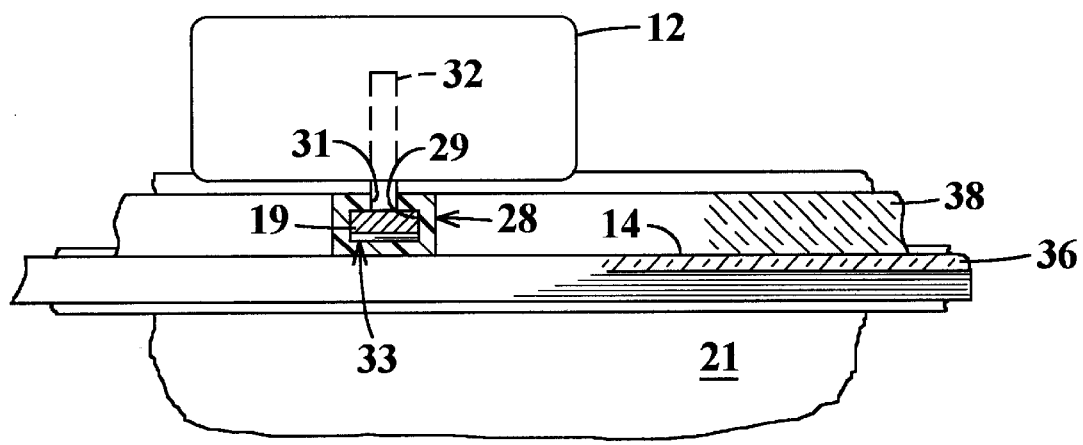
FIG. 3 is a cross section view taken along line 3—3 FIG. 2.
Figure 4:
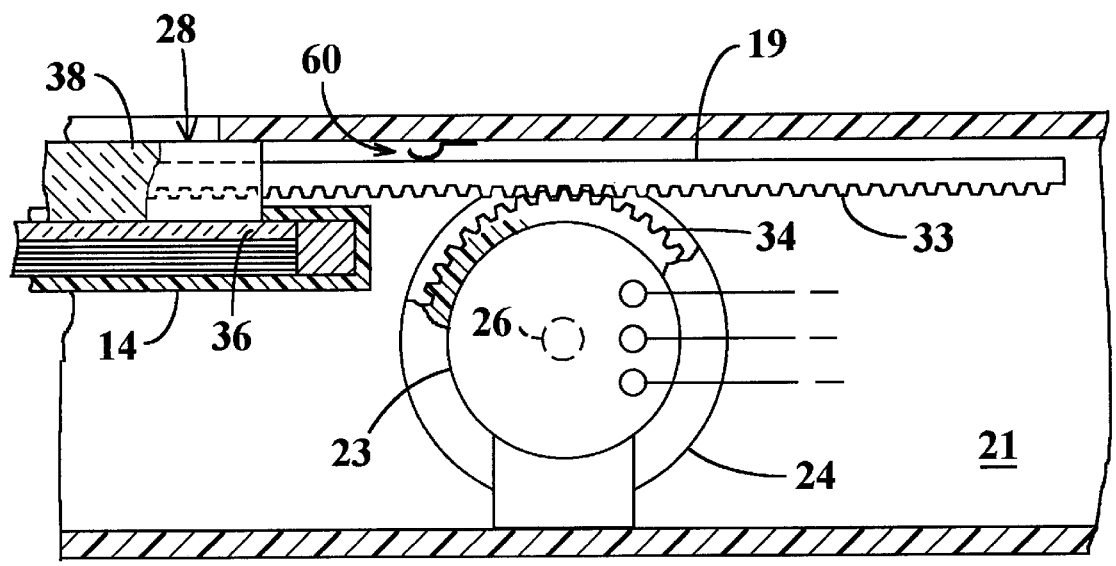
FIG. 4 is a cross section view taken along line 4—4 of FIG.2.

Referring to FIGS. 2 and 3, the track 13 of this embodiment has a linear track member 28 forming a longitudinal channel 29. Tongue 19 is situated in a relatively wide region of channel 29 and a narrower slot 31 at the front of the track member provides for connection of the movable cap 12 to the tongue 19 by a stem 32 Referring jointly to FIGS. 3 and 4, a linear set of gear teeth 33 extend along the tongue 19, at the back of the tongue in this example and engage a circular set of gear teeth 34 of rotary gear 24. Thus sliding movement of the tongue turns gear 24 and the shaft 26 on which the gear is mounted.

Display screens 14 of the flat panel type have a construction which includes a transparent cover layer 36 which forms the face of the screen. Track member 28 may be fastened to the cover layer 36 with adhesive or by other means. It is preferable, although not essential, that the track member 28 not protrude from the surface which underlies the slidable cap 12 as most operators prefer that there be a smooth surface at this location. A smooth surface is provided for in this embodiment by situating the track member 28 in a conforming slot 37 in an overlay cover plate 38 which is disposed against the cover layer 36 of the display screen itself. The overlay cover plate 38 has a thickness equal to the thickness of the track member 28 and thus an operator feels no protrusion along the path of travel of cap 12. In some cases, the track member 28 may be embedded in or be partially embedded in the cover layer 36 of the display screen but the cover layers of many such display screens are too thin for this arrangement.

Figure 5:
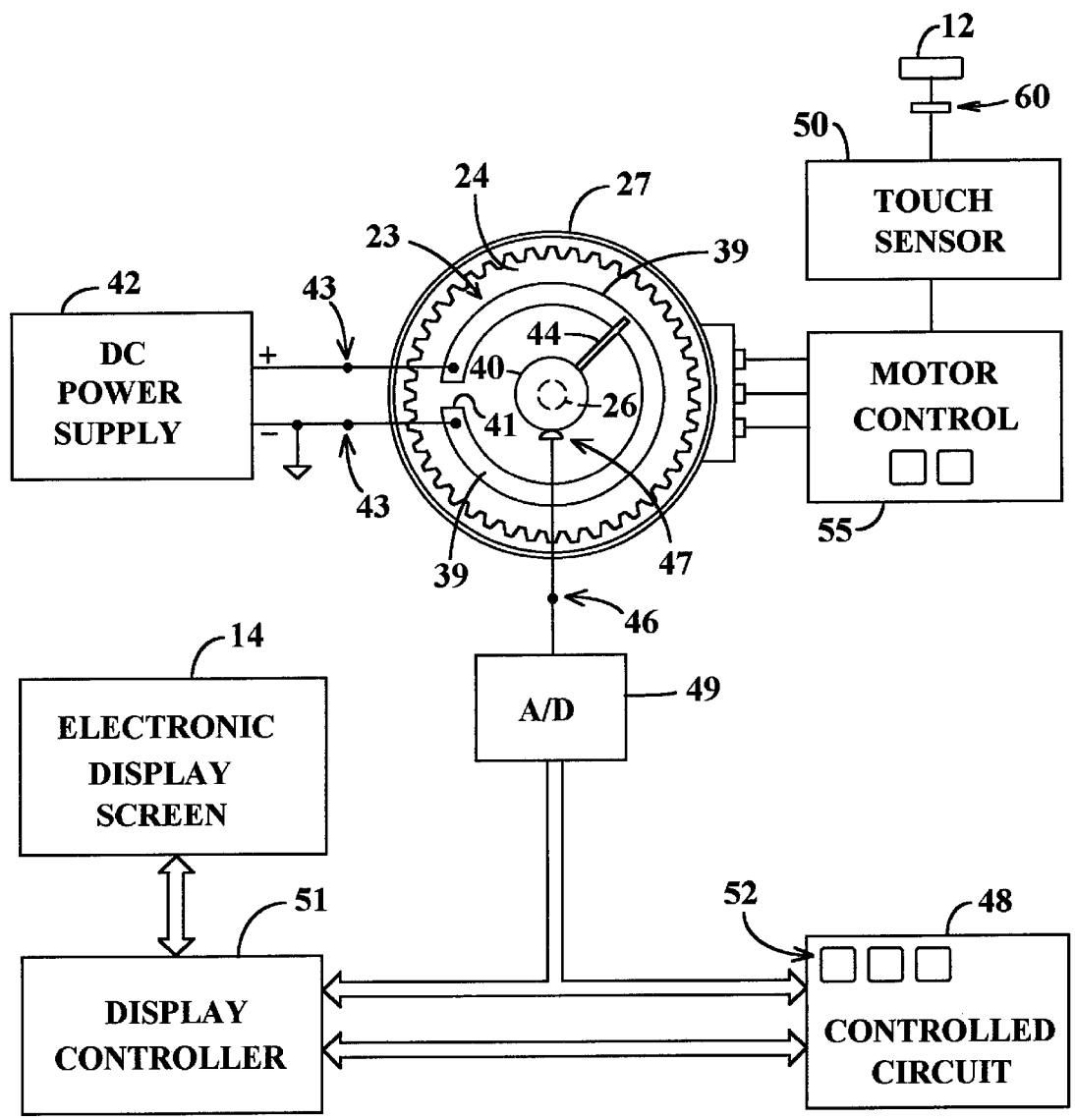
FIG. 5 is a schematic circuit diagram depicting electronic components of the apparatus of FIGS. 1 to 4.

Referring to FIG. 5, the signal varying component maybe any of variety of different designs and in this particular example is a rotary potentiometer 23. Potentiometer 23 has a resistor 39 which is of circular configuration except that a gap 41 is present at one point in the resistor. A direct current power supply 42 applies a voltage difference to the resistor 39 at opposite sides of the gap 41 through power terminals 43. A turnable conductor 44 extends from a disk 40 that turns with shaft 26 and rotary gear 24 and contacts the resistor 39 to receive a variable voltage which is a function of the angular orientation of the conductor 44. The variable voltage, is delivered to a control signal output terminal 46 of the potentiometer through a wiper 47 which is in sliding contact with disk 40.

The analog form control signal at control signal output terminal 46 is transmitted to the controlled circuit 48 through an analog to digital converter 49 in instances where the controlled circuit requires control signals in multi-bit digital form. The variable voltage at output terminal 46 may be delivered directly to a controlled circuit if it is of a type which responds to analog control signals. Graphics displayed by the electronic display screen 14 are established by a display screen controller 51 which may be of one of the known forms. The controlled circuit 48 provides a mode identifying signal to the display screen controller 51 in instances where the circuit has multiple modes of operation determined by operator actuation of mode selector switches 52 or by preprogrammed means. This enables display of different graphics during the different modes of operation. The digitized control signal from analog to digital converter 49 is also transmitted to display screen controller 51 in instances where the current value of the signal is to be displayed.

Referring jointly to FIGS. 3 and 5, it is advantageous in fader control devices which have a drive motor 27 if the motor is automatically deactivated when the operator is grasping the slidable knob or cap 12. This allows the operator to over-ride motor driven movements of the cap 12 at any time simply by touching the knob. For this purpose a touch sensing circuit 50 of one of the known kinds provides a turn off signal to the motor control circuit 55 in response to contact of an operator's hand with the cap 12. The touch sensing circuit 50 is electrically coupled to the cap 12 through a contact 60 within housing 21, shown in FIG. 4, that is positioned to bear against tongue 19. In instances where a touch sensing operation is present, with reference jointly to FIGS. 3 and 4, the cap 12, stem 32 and tongue 19 are formed of electrically conductive material or have a coating of such material while the track member 28 and gear 24 are formed of insulative material.

Figure 6:
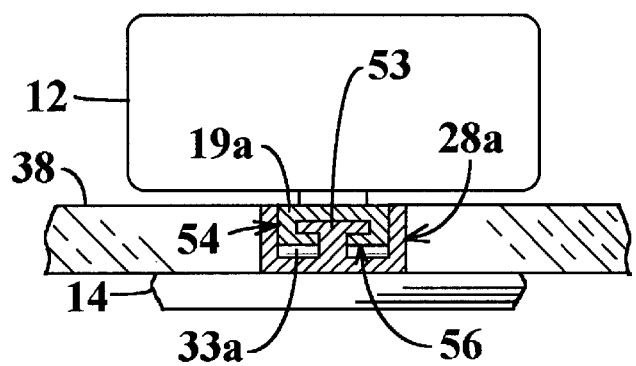
FIG. 6 is a cross section view depicting a modification of a movable cap and track component of the apparatus shown in FIG. 3.

The configuration and arrangement of mechanical components of the control signal producing means 17 shown in FIGS. 1 and 2 can be modified in any of a variety of ways. In the embodiment of FIG. 6, for example, the elongated track member 28a has a U-shaped cross, section and T-shaped rail portion 53 of the track member extends along its centerline. The elongated tongue 19a, to which slidable cap 12 is secured, has opposite sides 54 which extend down into track member 28a at each side of the rail portion 53 and has bottom portions 56 which extend towards the centerline of the track member 28a to clasp the tongue to the rail. Gear teeth 33a at the underside of the bottom portions 54 provide for the previously described engagement of the tongue with a rotary gear.

Figure 7:
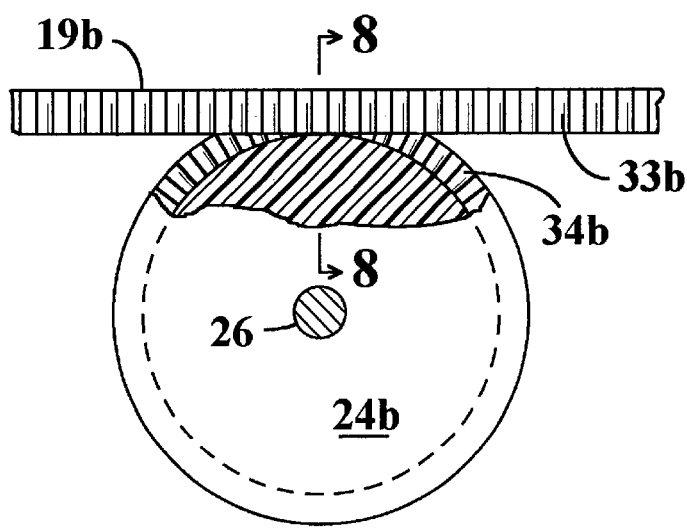
FIG. 7 is a broken out side view depicting a modification of a gear and gear driver member which are components of the apparatus shown in FIG. 4.
Figure 8:
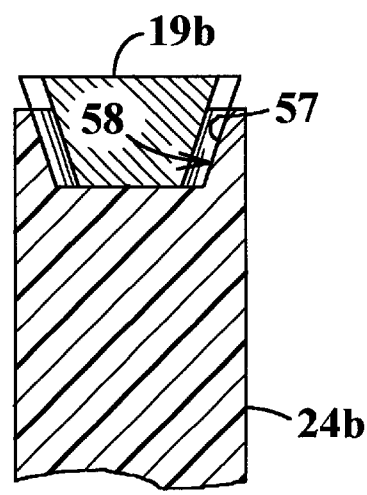
FIG. 8 is a section view taken along line 8—8 of FIG. 7.

FIGS. 7 and 8 depict a variation of the control device which the teeth on the tongue 19b include two sets of linear gear teeth 33b which extend along opposite sides of the tongue which sides are convergent in the downward direction. The rim of the rotary gear 24b which is turned by sliding movement of the tongue 19b has a circular groove 57 into which the tongue extends. Side walls 58 of groove 57 are slanted to conform with the slant of gear teeth 33b of the tongue 19b and have circular sets of gear teeth 34b which engage with the gear teeth of the tongue.

Figure 9:
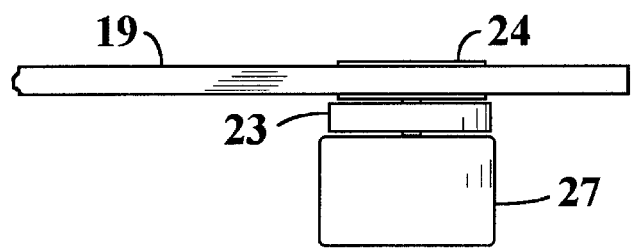
FIG. 9 depicts a modification of the cap motion detecting and signal generating means of the apparatus of the preceding figures.

Referring again to FIG. 1, the depicted positioning of the rotary gear 24, potentiometer 23 and motor 27 along shaft 26 can be varied. This can be advantageous where such components must be fitted into a restricted space along with other devices. For example with reference to FIG. 9, the potentiometer 23 and motor 27 may be situated at the same side of rotary gear 24.

Figure 10:
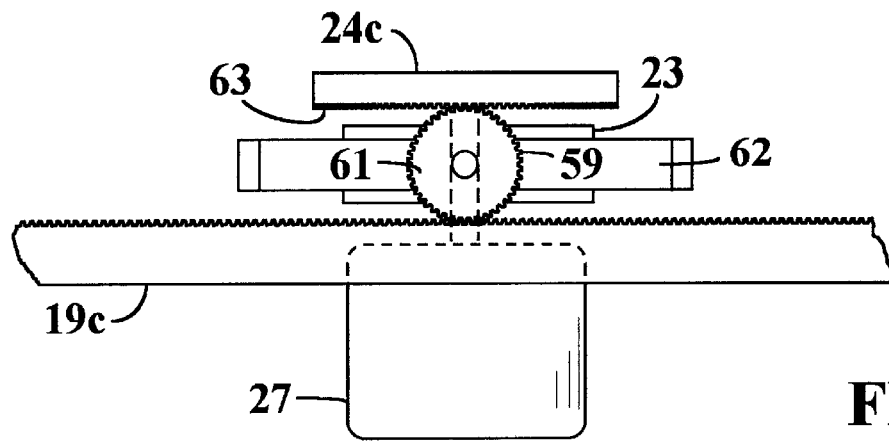
FIG. 10 depicts another modification of the cap motion detecting and signal generating means of the apparatus of the preceding figures.

FIG. 10 depicts another variation in which the potentiometer 23 and motor 27 are at the same side of the rotary gear 24c and in which these components are at a more centered position relative to the tongue 19c. In this embodiment the tongue 19c does not directly engage with the gear 24c. Rather, a linear set of gear teeth 33c extending along one side of the tongue 19c engage the teeth 59 of an intermediate gear 61 which is supported by a bracket 62 and which has an axis of rotation that is at right angles to the axis of rotation of gear 24c, potentiometer 23 and drive motor 27. Intermediate gear 61 engages with a circular set of teeth 63 situated at the side of the rim of rotary gear 24c that is adjacent to the intermediate gear.

Figure 11:
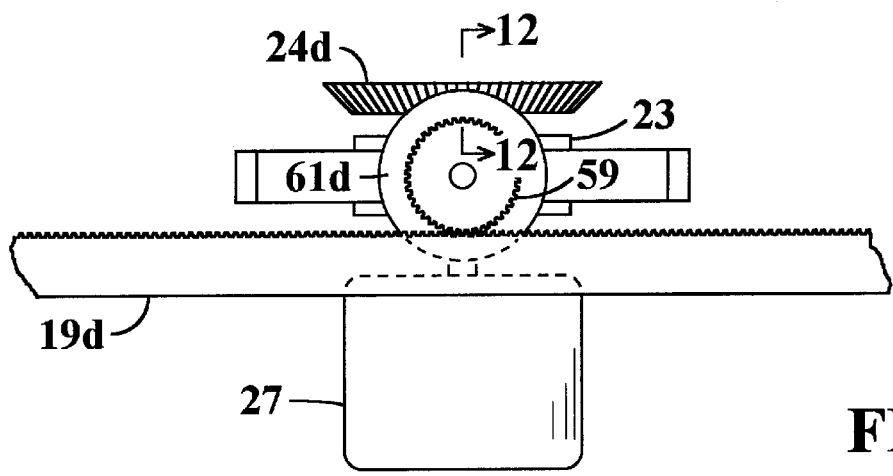
FIG. 11 depicts another modification of the cap motion detecting and signal generating means of the apparatus of the preceding figures.
Figure 12:
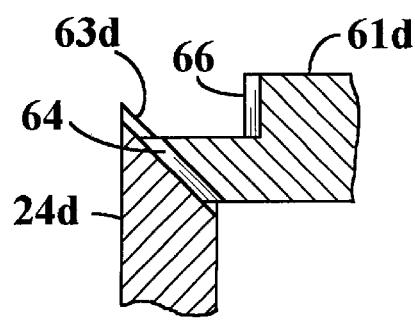
FIG. 12 is a section view taken along line 12—12 of FIG. 11.

FIGS. 11 and 12 depict a variation of the arrangement of the preceding figure in which the rotary gear 24d is a bevel gear and the intermediate gear 61d has bevel gear teeth 64 slanted to engage with the bevel gear teeth 63d of gear 24d. The intermediate gear 61 has a second set of teeth 66 which engage with the linear set of gear teeth 33d that extends along the side of the tongue 19d.

Figure 13:
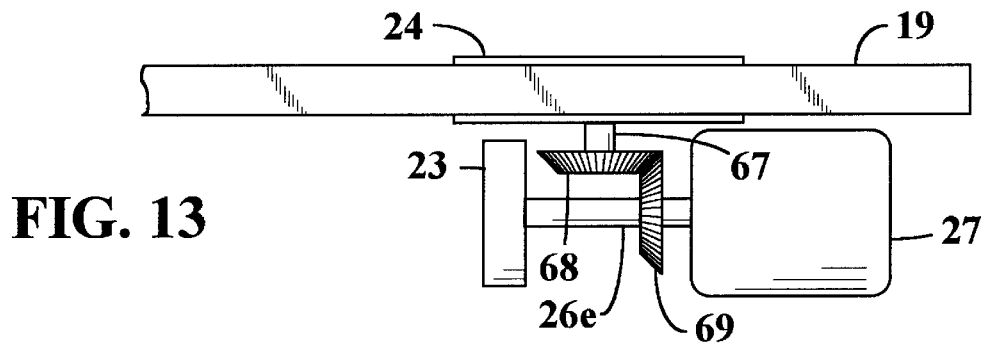
FIG. 13 depicts still another modification of the cap motion detecting and signal generating means of the apparatus of the preceding figures.

Referring again to FIG. 1, the rotary gear 24, potentiometer 17 and drive motor 27 of the previously described embodiments of the invention turn about a single axis of rotation which extends orthogonally relative to the path of travel of the tongue 19. FIG. 13 depicts a variation of the invention in which the shaft 26e which defines the axis of rotation of the movable contact of potentiometer 19 and of drive motor 27 extends in parallel relationship with tongue 19. Rotary gear 24 turns about a second shaft 67 which is oriented at right angles to shaft 26e. A first bevel gear 68 on shaft 67 engages with and turns a second bevel gear 69 on shaft 26e to transfer rotation of rotary gear 24 to the movable contact of potentiometer 17.

Figure 14:
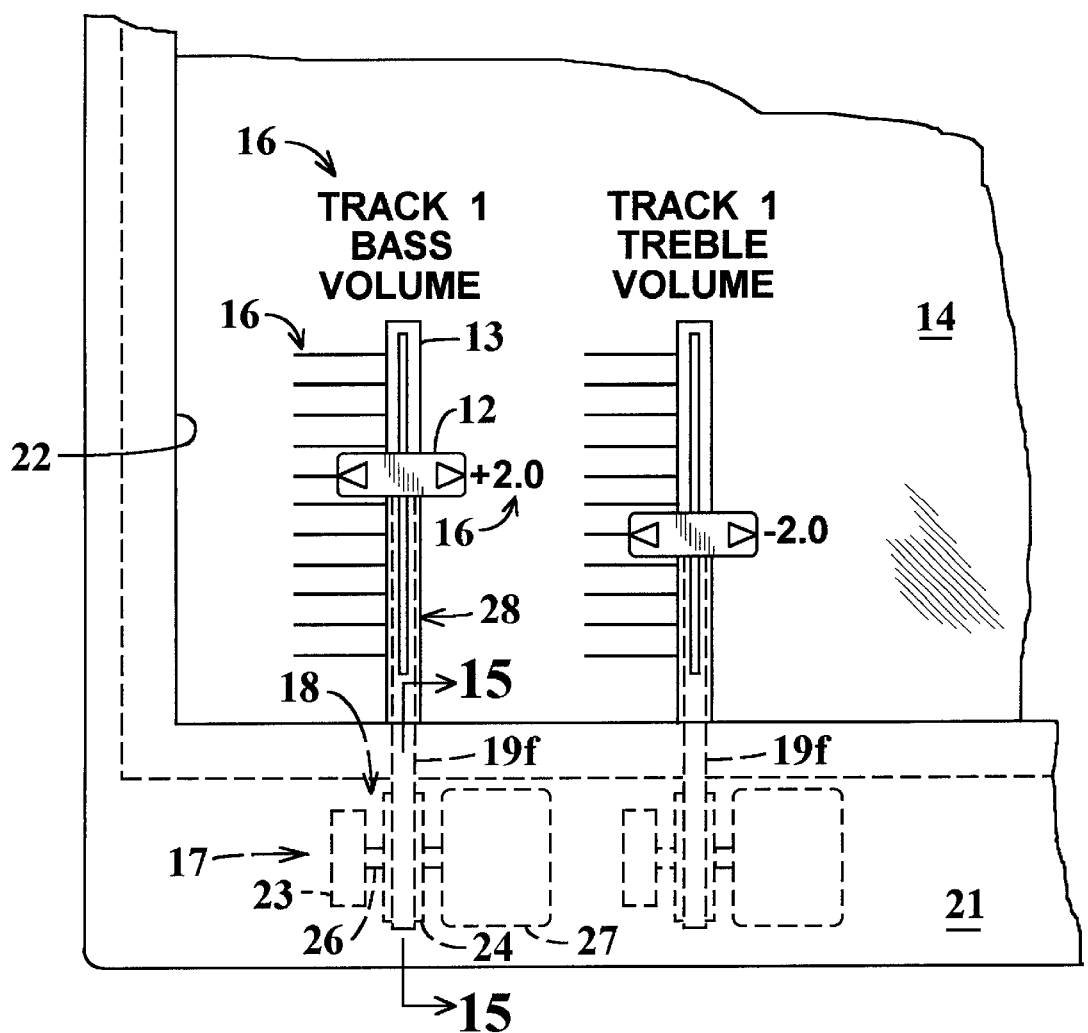
FIG. 14 is a front view of a control panel which is generally similar to the apparatus of the preceding figures while having structural modifications which enable the apparatus to be more compact.
Figure 15:
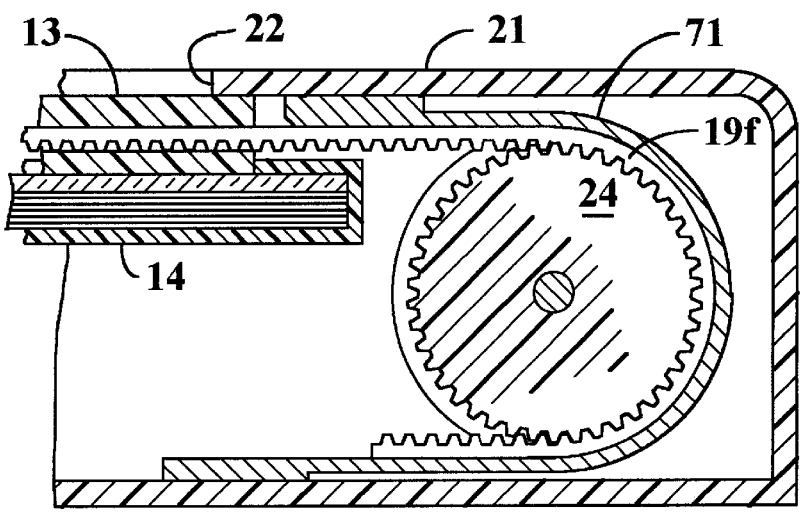
FIG. 15 is a section view taken along line 15—15 of FIG. 14.

Referring again to FIG. 1, the rigid tongue 19 of the previously described embodiments of the invention requires that sizable space be provided within housing 21 to accommodate to outward travel of the tongue from the location of rotary gear 24. In some instances it may be desirable to minimize the size of housing 21 or to locate other structure within the housing at a location close to the gear 24. Referring jointly to FIGS. 14 and 15, this can be provided for by utilizing a tongue 19f formed of a resilient flexible material. The tongue 19f may then wrap around gear 24 rather than extending further outward from the display screen 14. The tongue 19f may, for example, be formed of spring steel although other materials having similar properties may also be used.

Figure 16:
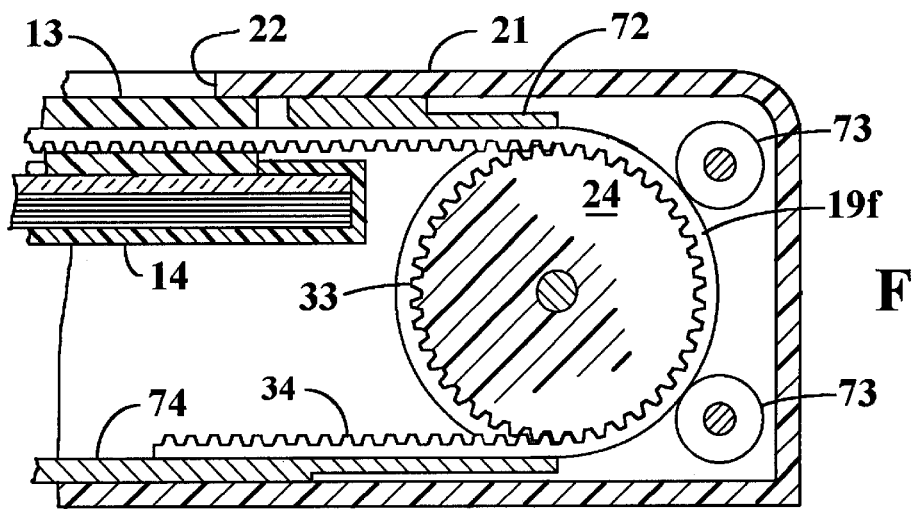
FIG. 16 depicts a modification of the apparatus shown in FIG. 15.

In this example a curved tongue tensioning guide 71 extends from a location adjacent to the edge of screen 14 towards gear 24 and around the gear, the guide being shaped and positioned to force flexing of the tongue 19f into a curvature which conforms with that of the circular set of teeth 34 of the gear and to hold the tongue in engagement with the gear. In another example, shown in FIG. 16, a first tongue guide 72 is linear and extends along the tongue 19f only to the point where the tongue begins to engage gear 24. Rotatable tongue tensioning rollers 73 are positioned to bear against the portion of the tongue 19f that curves around the gear 24 to force the tongue into a curvature at which the teeth 33 of the tongue engage with the teeth 34 of the gear. The end portion of the tongue 19f than slides along another linear tongue guide 74 which extends along the base of housing 21.

Figure 17:
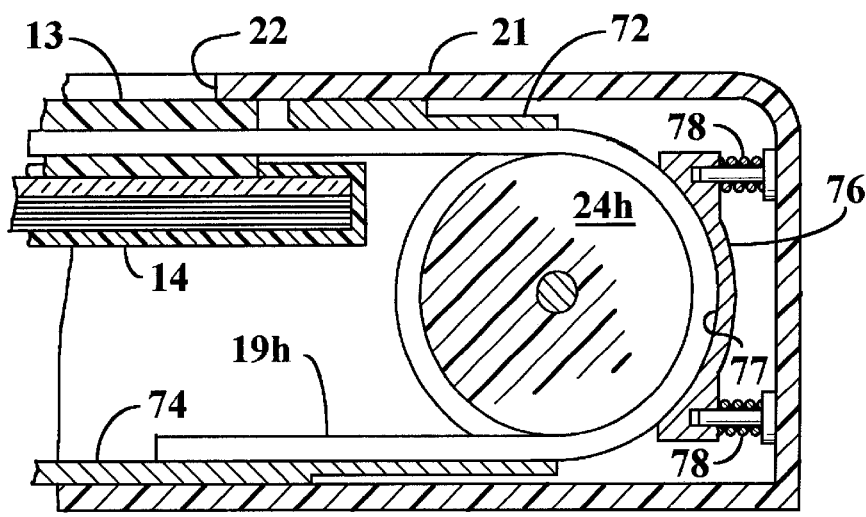
FIG. 17 depicts a modification of the apparatus shown in FIG. 16.

As shown in FIG. 17, the flexible tongue engaging gear of the previously described embodiments may in some instances be replaced with a wheel 24h which has no teeth and the tongue 19h itself need have no teeth as a frictional engagement is possible. In this embodiment a pressure plate 76 has a curved surface 77 which bears against the flexed portion of the tongue 19h as it travels around the wheel 24h. Springs 78 urge the pressure plate against the tongue 19h and wheel 24 with sufficient force to cause the wheel to turn in response to travel of the tongue. Springs 78 are compression springs in this example but may be replaced with leaf springs or other resilient elements. Except as herein described the embodiment of FIG. 17 may be similar to the embodiment of FIG. 16.

Figure 18:
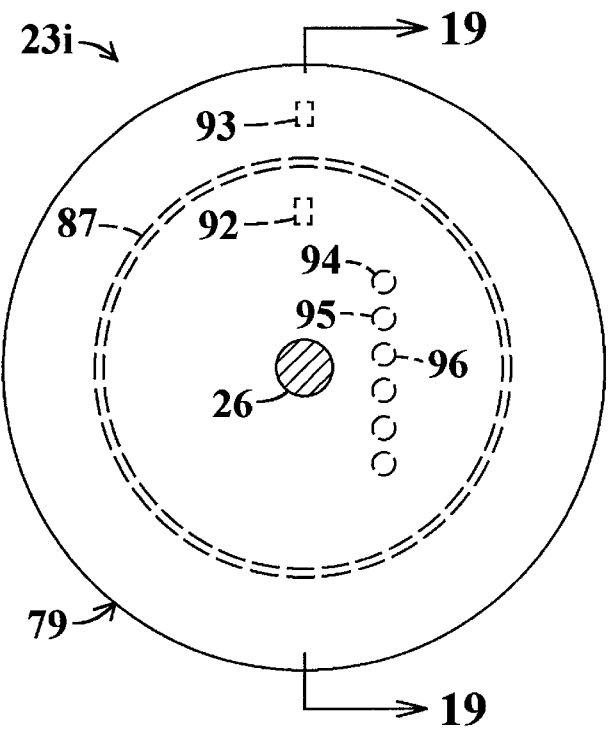
FIG. 18 is a side view of a first embodiment of a rotary encoder which can replace a rotary potentiometer component of the apparatus of the preceding figures.
Figure 19:
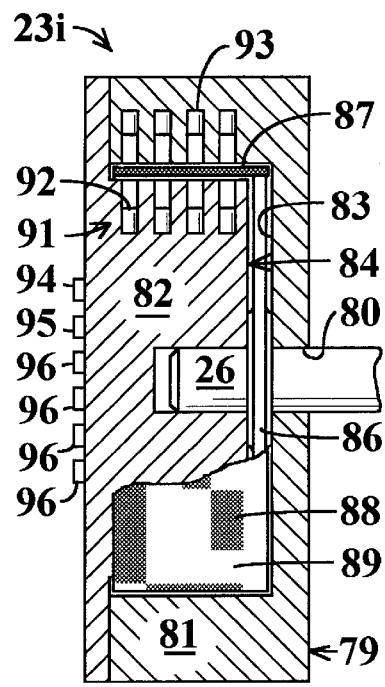
FIG. 19 is an axial section view of the rotary encoder of FIG. 18 taken along line 19—19 thereof.

The rotary potentiometer of the control signal producing means of the previously described embodiments of the invention can be replaced with any of a variety of different rotary encoders that produce a signal which is varied by rotation of a shaft. FIGS. 18 and 19 depict a first example of a rotary encoder 23i which is suitable for this purpose. Encoder 23i has a circular housing 79 with an axially directed passage 80 into which the previously described gear driven rotatable shaft 26 of the control device extends. The housing 79 of this example is formed by a first member 81 secured to a second housing member 82. The first housing member 81 forms a circular chamber 83 into which a conforming portion 84 of the second housing member 82 is fitted. Housing members 81 and 82 are proportioned to provide space for a circular disk 86 within chamber 83 which is secured to the rotatable shaft 26 in coaxial relationship therewith. The housing members 81 and 82 are also proportioned to provide space for a cylinder 87 which is secured to the rim of disk 86 and which is coaxial with the disk and shaft 26. Thus cylinder 87 turns with the shaft 26 about the axis of rotation of the shaft when the setting of the control device is changed in the previously described manner.

Encoder operates by photo-optical sensing of the angular orientation of cylinder 87. To enable such sensing, the cylinders 87 is formed of light transparent material which has areas 88 of opaque coating thereon. The opaque areas 88 in conjunction with adjacent transparent areas 89 of the cylinder 87 provide coding which identifies successive locations around the cylinder in a manner that will hereinafter be described.

Photo-optical sensing means 91 of this example includes a row of small light detectors 92 which view separate ones of a parallel row of light sources 93 through the cylinder 87, the rows of light detectors and light sources being parallel the axis of rotation of the cylinder. The light sources 93 of this example are disposed in the first housing member 81 at locations which are outside cylinder 87 and the detectors 92 are in the second housing member 84 at locations within the cylinder but these locations of the sources and detectors may be reversed if desired. The light sources 93 of this particular example are light emitting diodes and the light detectors 92 are phototransistors although other types of light source and light detector may also be used. Electrical connections to the light sources 93 and detectors 92 will be hereinafter described and are provided for by a pair of power terminals 94 and 95 and four signal terminals 96 which are situated at an exterior surface of the second housing member 82.

Figure 20:
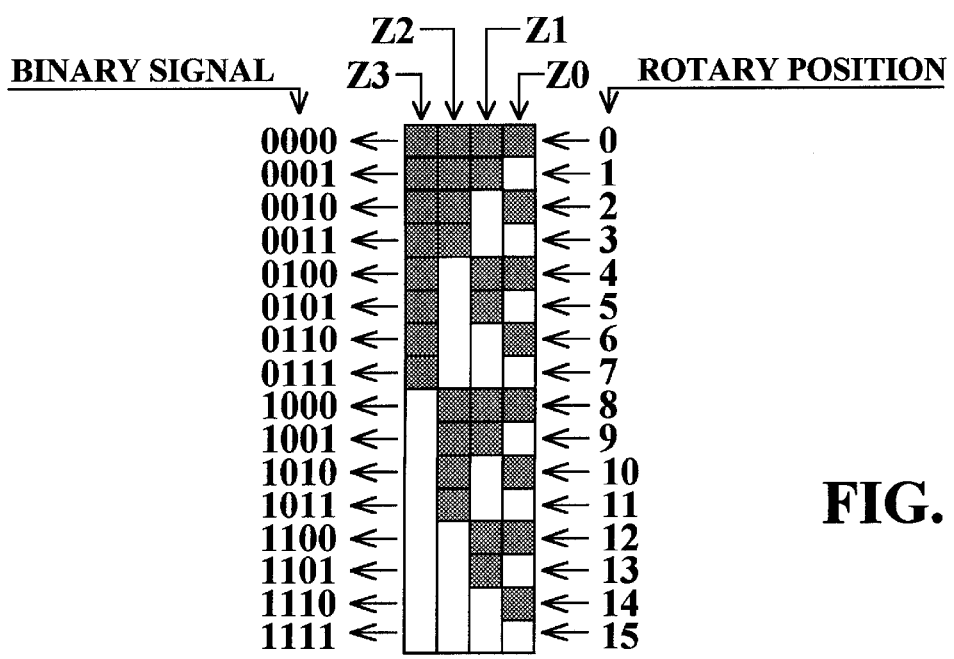
FIG. 20 is a diagrammatic depiction of an encoding pattern on a component of the,apparatus of FIGS. 18 and 19.

To facilitate an understanding of the coding FIG. 20 depicts the cylinder 87 in a flattened out form. The coding is defined by annular zones Z0, Z1, Z2 and Z3 which extend around the cylinder in side by side relationship and each of which contains a different pattern of opaque areas 88 and transparent areas 89. Referring jointly to FIGS. 19 and. 20, each phototransistor 93 is positioned to view a light source 92 through a separate one of the zones Z0, Z1, Z2 and Z3 of cylinder 87. Each phototransistor 93 is turned on when it views a transparent area 89 of cylinder 87 and is turned off when it views an opaque area 88 of the cylinder. The transparent areas 89 and opaque areas 88 along zone Z1 are twice as long as the areas 89 and 88 along zone Z0 and each successive zone Z2 and Z3 has areas 89 and 88 that are twice as long as the areas 88 and 89 along the preceding zone. This causes the four phototransistors 92 to producers a four bit binary signal that has a different value at each of sixteen different angular orientations of the cylinder 87.

Figure 21:
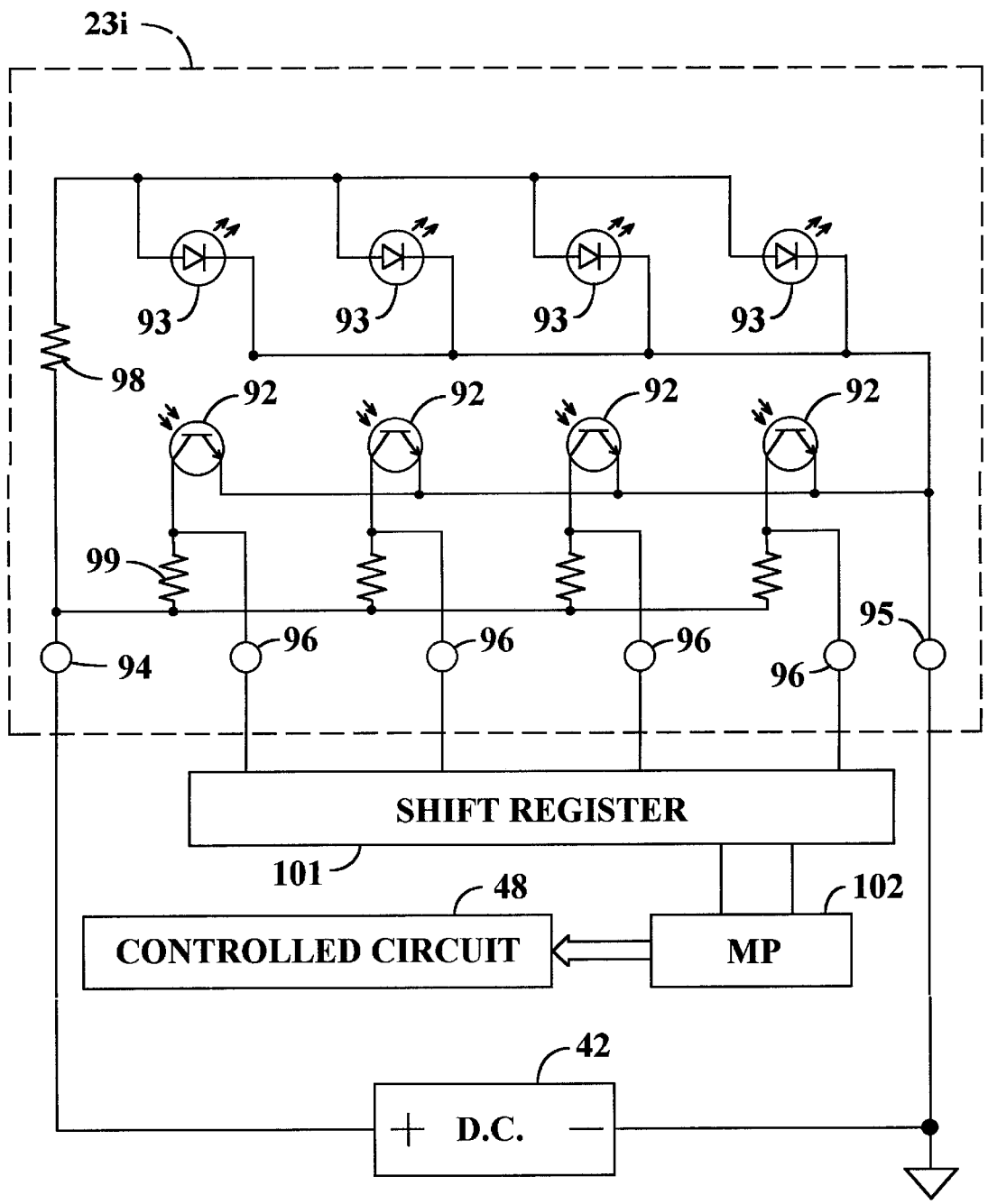
FIG. 21 is a schematic electrical circuit diagram showing interconnections between electronic components of the apparatus of FIGS. 18 to 20.

Referring to FIG. 21, a direct current power supply 42 is connected to the power terminals 94 and 95 of the rotary encoder 23i. The four light emitting diodes 93 are connected in parallel across power terminals 94 and 95 through a current limiting resistor 98. The collector of each phototransistor 92 is connected to the positive power terminal 94 through a separate one of four additional resistors 99 and the emitters of the phototransistors are connected to the negative power supply terminal 95. The collectors of the phototransistors 92 are also each individually connected to a separate one of the signal output terminals 96 of rotary encoder 23i. Thus the voltage at each signal output terminal 96 is at a high state when the phototransistor 92 to which it is connected is in the off condition and goes to a low state when the phototransistor is turned on. The high state voltage level defines a binary "0" and the low state defines a binary "1". Thus, with reference again to FIGS. 20 and 21, at any given time the voltage levels at signal output terminals 96 define a four bit binary number that identifies a particular one of sixteen different angular orientations of the cylinder 87.

The binary digital signal produced at output terminals 96 may be transmitted directly to a controlled circuit 48 if the circuit is one which responds to control signals of that form. Alternately as in the present example, each output terminal 96 is connected to a separate input of a shift register 101. A microprocessor 102 repetitively reads out the contents of the shift register 101, refers to an internally configured look up table to identify a predetermined desired control signal value for the current angular orientation of cylinder 87 and outputs a control signal of that value to the controlled circuit 48. The control signal may be changed to a variable voltage by a digital to analog converter if the controlled circuit is one which requires an analog type of control signal.

The use of four optically coded zones Z0, Z1, Z2 and Z3 on the cylinder 87 in this example enables detection of sixteen different rotary positions of the cylinder. Fewer zones may be used if the controlled circuit does not require that many different control signal values. Additional zones, light emitting diodes and phototransistors may be provided if greater resolution between successive angular orientations of cylinder 87 is needed.

Figure 22:
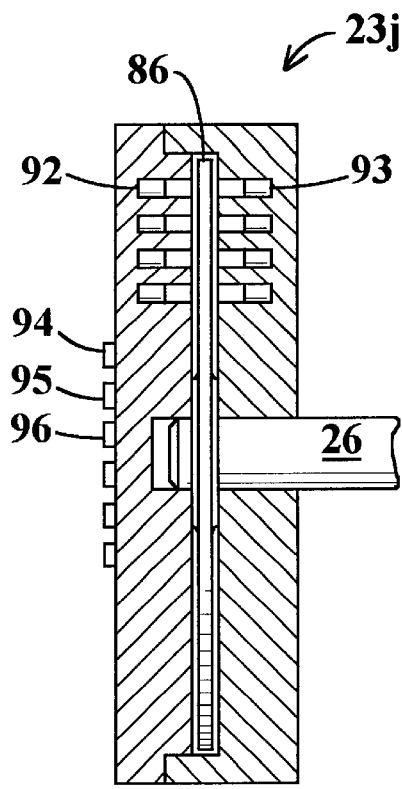
FIG. 22 is a side view of a second embodiment of rotary encoder which can replace the rotary potentiometer component of the apparatus of FIGS. 1 to 17.
Figure 23:
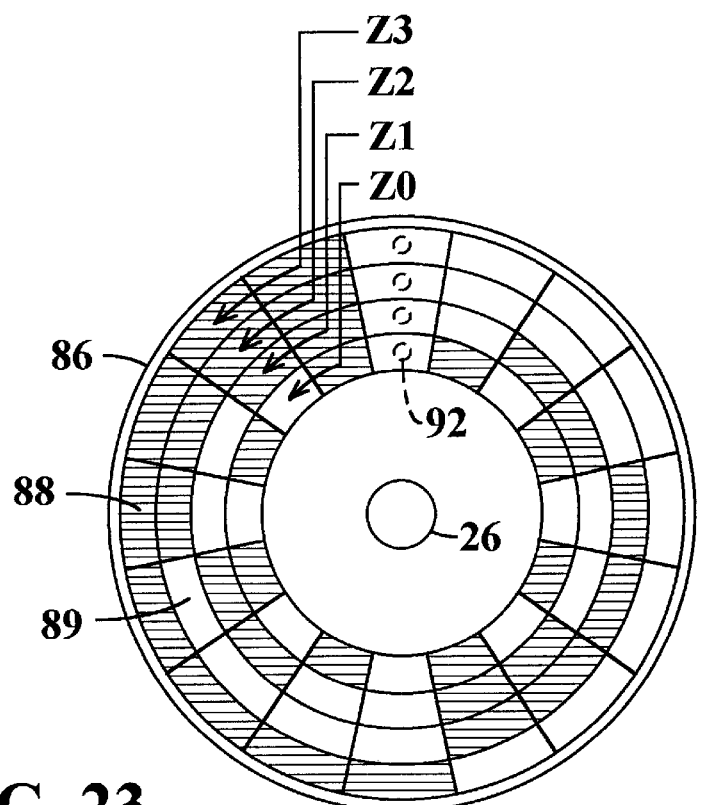
FIG. 23 is a diagrammatic depiction of an encoding pattern on a component of the apparatus of FIG. 22.

The width of a rotary encoder 23i of the above described type can be reduced by eliminating the cylinder 87 and emplacing the coding on the disk 86. A modified rotary encoder 23j of this kind is depicted in FIGS. 22 and 23. In the embodiment of 103 FIGS. 22 and 23, the disk 86 is formed of light transparent material and the four zones Z0, Z1, Z2 and Z3 of coding are concentric rings of progressively increasing diameter situated on a face of the disk and being centered on the axis of rotation of the disk. Opaque areas 88 of the coding zones Z0, Z1, Z2 and Z3 are areas of opaque material adhered to or otherwise formed on the face of the disk 86. The light sources 93 and light detectors 92 are situated at opposite sides of disk 86 and are spaced apart along a radius of the disk, the light sources and light detectors being at locations where each detector views its light source through a separate one of the coding zones Z0, Z1, Z2 and Z3. Electrical interconnection of the light sources 93, light detectors 92, power terminals 94, 95 and signal output terminals 96 as well as connections to external circuitry may all be as previously described with reference to FIG. 21.

Figure 24:
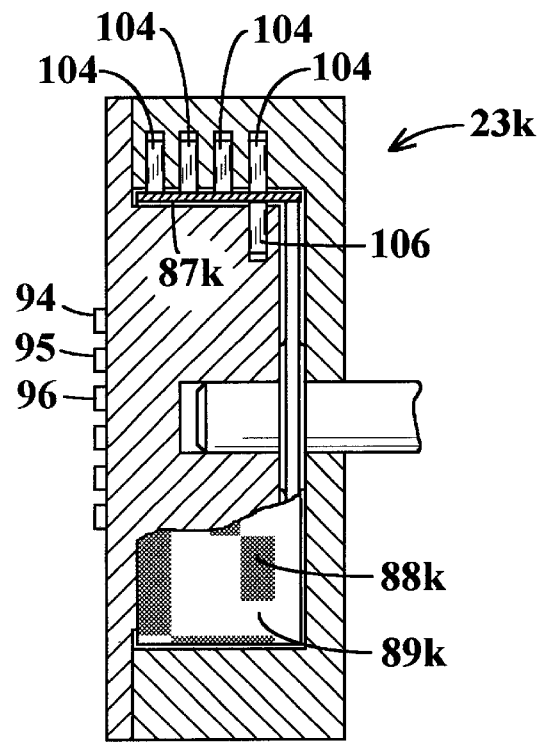
FIG. 24 is an axial section view of a third embodiment of a rotary encoder which can replace the rotary potentiometer component of the apparatus of FIGS. 1 to 17.
Figure 25:
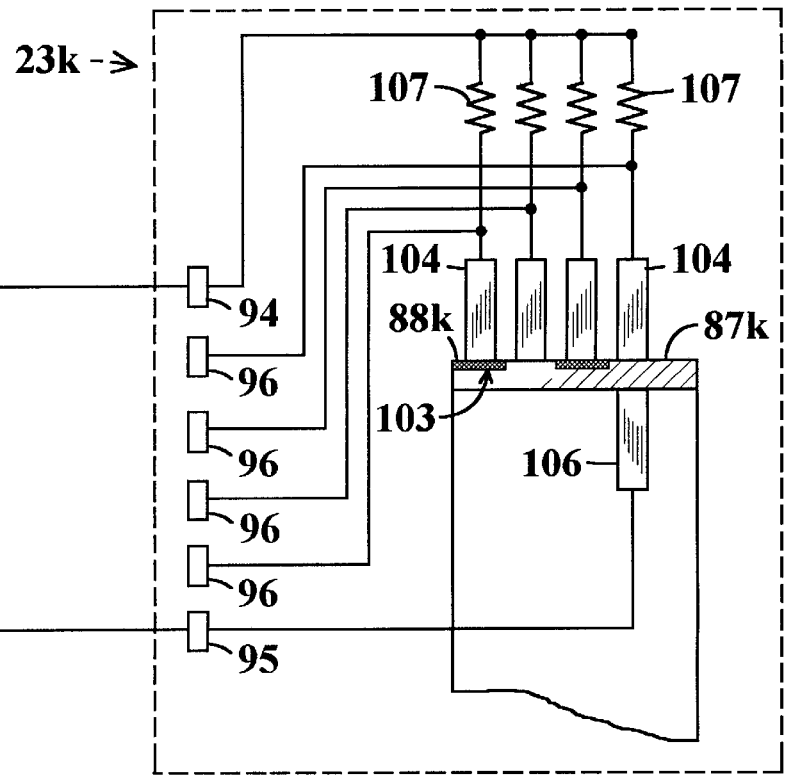
FIG. 25 is a schematic electrical circuit diagram showing interconnections between electronic components of the apparatus of FIG. 24.

Rotary encoders of the above described type do not necessarily require photo-optical detection of the orientation of a rotary element such as a cylinder or disk. A variety of other position sensing means can be employed. FIGS. 24 and 25 depict another embodiment of the rotary encoder 23k which is similar to that previously described with reference to FIGS. 18 to 20 except that the light sources and light detectors of the previously described embodiment are eliminated and replaced with electromechanical code sensing means.

Referring to FIGS. 24 and 25, the coded cylinder 87k in this instance is formed of electrically conductive material. Areas 89k of the coding which were previously described as being transparent are in this instance areas at which the conductive material of the cylinder 87k is exposed at the outer surface of the cylinder. Coding areas 88k which were previously described as being opaque are in this instance areas at which thin layers 103 of electrically insulative material are inset into the surface of the cylinder 87k. The pattern of the coding may be similar to that previously described with reference to FIG. 20.

Referring to FIGS. 24 and 25, four resilient electrically conductive code reading contacts 104 are secured within the first housing member 81k in positions where each contacts the outer surface of cylinder 87k at the location of a separate one of the previously described coding zones of the cylinder. An additional contact 106 of this kind is secured within the second housing member 82k in position to contact the inner surface of cylinder 87k. The positive terminal of the external direct current power supply 42 is connected to each of the code reading contacts 104 through the positive power terminal 94 of encoder 23k and a separate one of four resistors 107. The additional contact 106 is connected to the other terminal of power supply 42 through the other power terminal 95 of the encoder 23k. Each code reading contract 104 is also connected to a separate one of the signal output terminals 96 of the encoder 23k.

The voltage at each of the code reading contacts 104 is at a low state when it contacts a conductive area 89k of cylinder 87k and rises to a high state when it contacts an insulative area 88k. Thus the encoder 23k outputs a four bit binary signal, identifying the current angular orientation of cylinder 87k, that is similar to the control signal output of the previously described encoders and which may be utilized in a similar way.

Except as described above, the rotary encoder 23k may be similar to the encoder 23i previously described with reference to FIGS. 18 to 21.

Rotary encoders in circuit control devices which embody the invention can employ any of a variety of other forms of coding on the rotary cylinder or disk and any of a variety of other devices for reading such coding and producing a control signal determined by the angular orientation of the cylinder or disk. Further examples of such coding and reading devices are described in U.S. Pat. No. 5,805,146 except insofar as the coding in the prior patent lies on a flat surface extending within or adjacent to the track of the slidable control device at the face of the display screen itself. Placing of such coding on a rotary cylinder or disk as herein described enables the coded components and reading devices to be located off of the screen. These examples of other forms of coding and reading devices are described at column 13, line 48 to column 20, line 59, and FIGS. 21 to 24, 24A, 24B, 25, 26, 26A, 26B, 26C, 26D, 27, 27A, 28, 29, 30, 31, 31A, 31B, 31C, 31D, 31E, 32, 33, 33A and 34 of U.S. Pat. No. 5,805,146 which is herein incorporated by reference.

Figure 26:
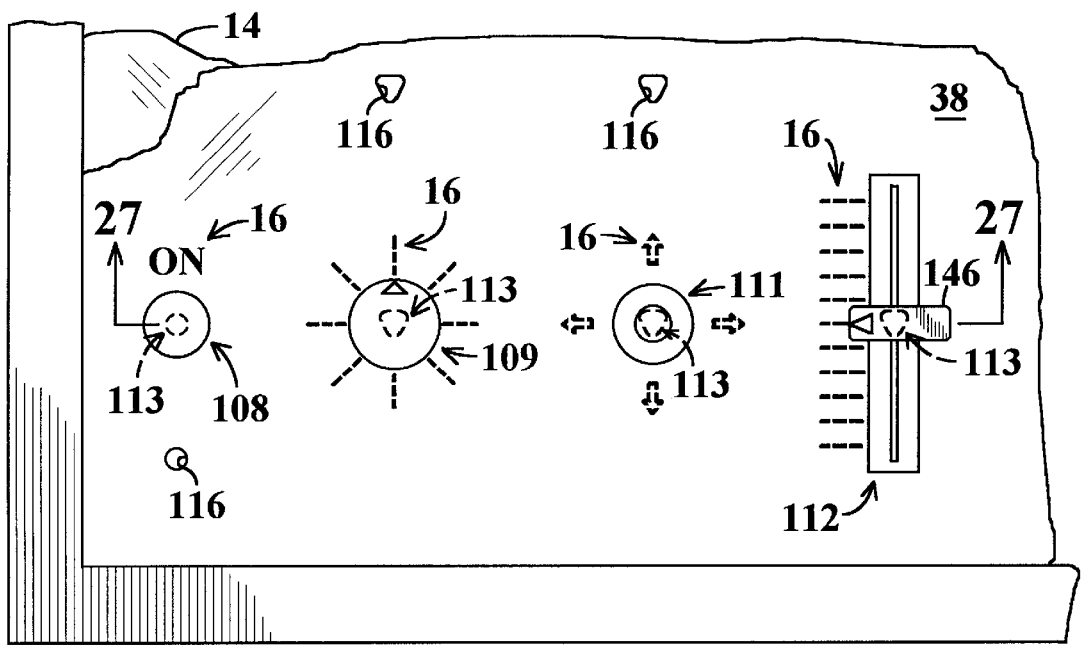
FIG. 26 depicts a portion of an electronic display screen having circuit control devices at the face of the screen and in which the circuit control device is snap engage in place.
Figure 27:
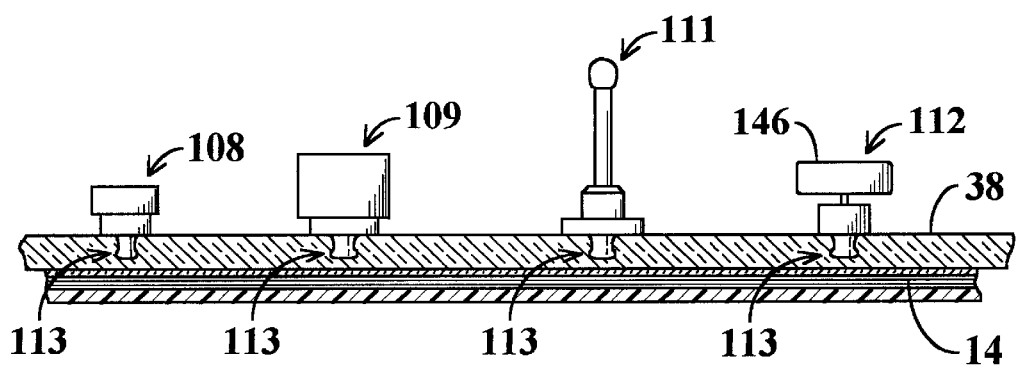
FIG. 27 is a section view taken along line 27—27 of FIG. 26.

It is advantageous if circuit control devices which are disposed in front of an electronic display screen can be easily emplaced and removed without necessarily requiring the services of a trained technician. This enables operator replacement of a worn control device or replacement of one type of control device with another. It is also advantageous if a control device can be easily moved from one location on the screen to another to enable different modes of operation. Referring jointly to FIGS. 26 and 27, one way of realizing these objectives is to attach the control devices 108, 109, 111 and 112 at the face of the display screen 14 by snap engagements 113. For purposes of example, FIGS. 26 and 27 depict a push button type of switch 108, a rotary knob type of control device 109, a joystick type of control device 111 and a fader or sliding cap type of control device 112 which snap engage a transparent overlay plate 38 which is at the face of the display screen 14. The internal constructions of the control devices 108, 109, 111 and 112, including control signal producing means therein may be of any of the known forms described in the hereinbefore identified prior US patents. As in prior control apparatus of this kind, the display screen 14 displays graphics 16 for assisting the operator of the apparatus.

Figure 28:
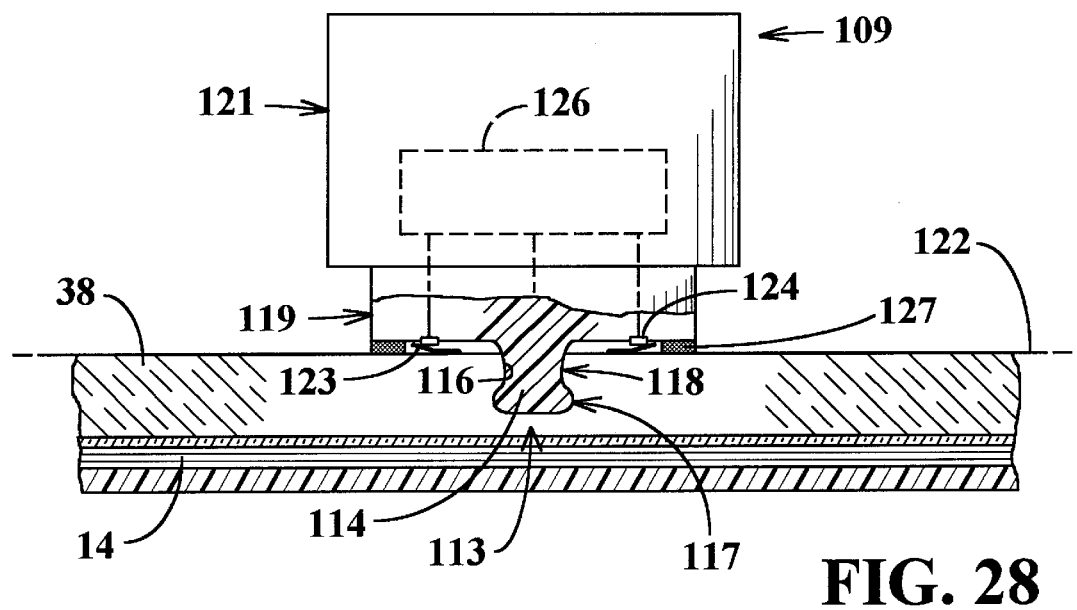
FIG. 28 is a side view, partially in section, of a first circuit control device which snap engages at the face of an electronic display screen.
Figure 29:
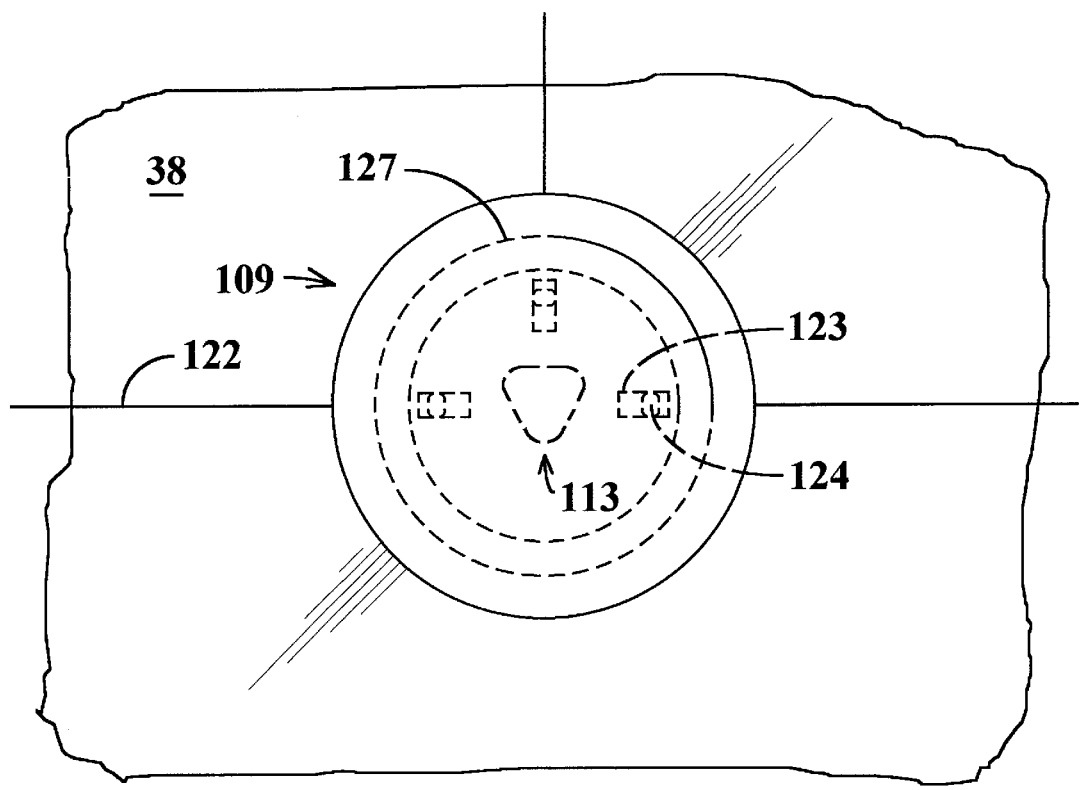
FIG. 29 is a top view of the circuit control device of FIG. 28.

Referring to FIGS. 28 and 29, snap engagements 113 include a protrusion 114 which extends from the underside of the control device 109 into an opening 116 in the screen overlay plate 38. A region 117 of the protrusion 114 and opening 116 is slightly broader than another region 118 that is closer to the entrance of the opening. The protrusion 114 and/or the overlay plate 38 are formed of resilient material such as resilient plastic. Consequently the protrusion 114 can be forced into opening 116 by application of a force sufficient to momentarily deform the resilient material. The snap engagement 113 then resists withdrawal of the protrusion 114 but this can be accomplished if sufficient force is exerted.

Some rotary control devices 109 have a base portion 119 which is fixed against rotation while a knob portion 121 of the control is turnable by a the operator. Rotation of the base portion 119 can be prevented by forming the opening 116 and protrusion 114 to have a non-circular configuration. In this example the opening 116 and protrusion 114 have a generally triangular cross section except that the corners of the triangle are rounded. This configuration also dictates that the control device 109 be emplaced on the screen 14 at one specific angular orientation thereon if the triangular shape is non-equilateral.

Turning of the base of a control device can also be prevented if more than one of the snap engagements 113 is present, an example of this construction being hereinafter described.

Electrical connections to the control device 109 of this example are provided for by traces 122 of electrically conductive material which extend along a surface of the overlay plate from the edge region of the display screen 14. Traces 122 connect with leaf spring contacts 123 which are at the outer surface of the overlay plate in position to be contacted and depressed by contacts 124 which protrude slightly from the underside of the base 119 of control device 109. Contacts 124 are connected to the control signal producing circuit 126 within the control device 109 which may be of any of the known forms such as, for one example, a rotary potentiometer of the kind which has been hereinbefore described with reference to FIG. 5.

Referring again to FIGS. 28 and 29, the control device 109 is supported in a more stable manner if a thin annular guide 127 is secured to the underside of the base portion 119 in coaxial relationship with protrusion 114. The guide 127 may formed of felt or Teflon plastic among other materials. In addition to stabilizing the control device 109, guide 127 functions as a dust seal which keeps foreign material away from the snap engagement 113 and the electrical contacts 123, 124.

Referring to FIGS. 30 and 31, some types of control device 109a which are turned by the operator to vary a control signal do not have a turnable knob mounted on a fixed base. The operator turns the entire unit as a whole. In one example, the control signal producing circuit 126a within the control device 109a has a photo-optical sensor 128, such as a phototransistor or photodiode, which views the underlying display screen 12 through a passage 129 in the body of the control device. The screen 12 is conditioned to display an image which causes the output of the photo-optical sensor 128 to change as the control device 109a is turned about its axis of rotation. For example, as depicted diagramatically in FIG. 32, the image, 131 may be annular band in which the light intensity at successive areas of the band progressively increases or decreases. In control device 109a of this type which are turned as a unit, with reference again to FIGS. 30 and 31, the snap engagement protrusion 114a and the opening 116a in which it seats have circular cross sections in order to enable the turning motion.

Various steps may be taken to facilitate the turning of the control device 109a. For example, the inner surface of the opening 116a and outer surface of protrusion 114a may be polished. Lubricant may be provided within the opening 116a. One or both of the protrusion 114a and the wall of opening 116a may have a coating or liner 132 of low friction material such as Teflon for example.

Electrical connections to snap engaged control devices 109a which turn as a unit may be similar to those previously described with reference to FIGS. 28, and 29 except that, referring again to FIGS. 30 and 31, the contacts 124a at the underside of the control device 109a are circular bands of differing diameter which are centered on the axis of rotation of the control device. The leaf spring contacts 123a on overlay plate 38 are spaced at different distances from the axis of rotation such that each contacts a different one of the circular band contacts 124a.

Figure 33:
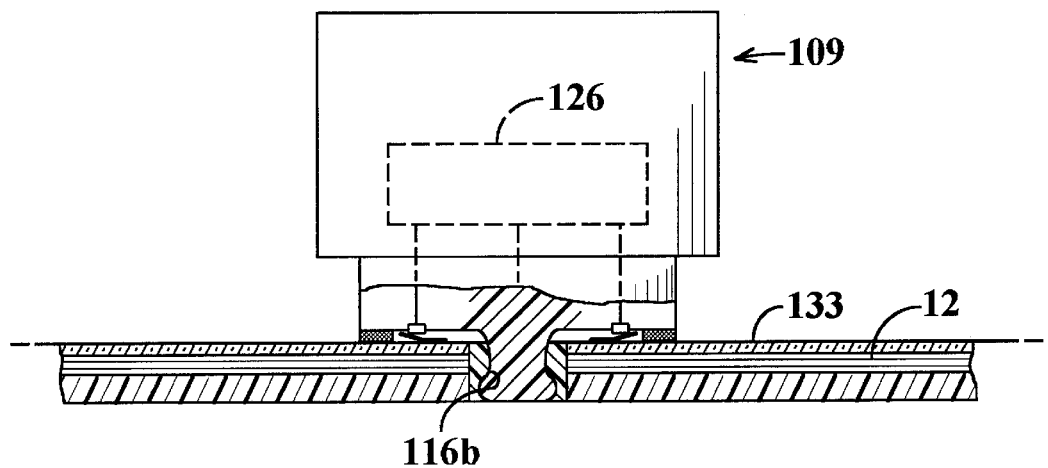
FIG. 33 is a side view partially in section, of a third circuit control device which snap engages at the face of an electronic display screen.

The snap engaged control devices which have been described up to this point engage in openings in an overlay plate 38 which is disposed against the face of an electronic display screen 12. The outermost layer 133 of electronic display screens 12 is transparent but in most cases is too thin to contain snap engagement openings 116a of adequate size. The openings can be formed in the outermost layer 133 of the screen 12 and the overlay, plate 38 is not needed in instances where the screen has an outer layer of sufficient thickness for the purpose. Referring to FIG. 33, the snap engagement opening 116b can be an opening which extends into or through the display screen 12 itself although this requires that the screen have a specialized construction. Techniques for forming openings within a flat panel display screen are described in prior U.S. Pat. No. 5,977,955 which is herein incorporated by reference.

Figure 34:
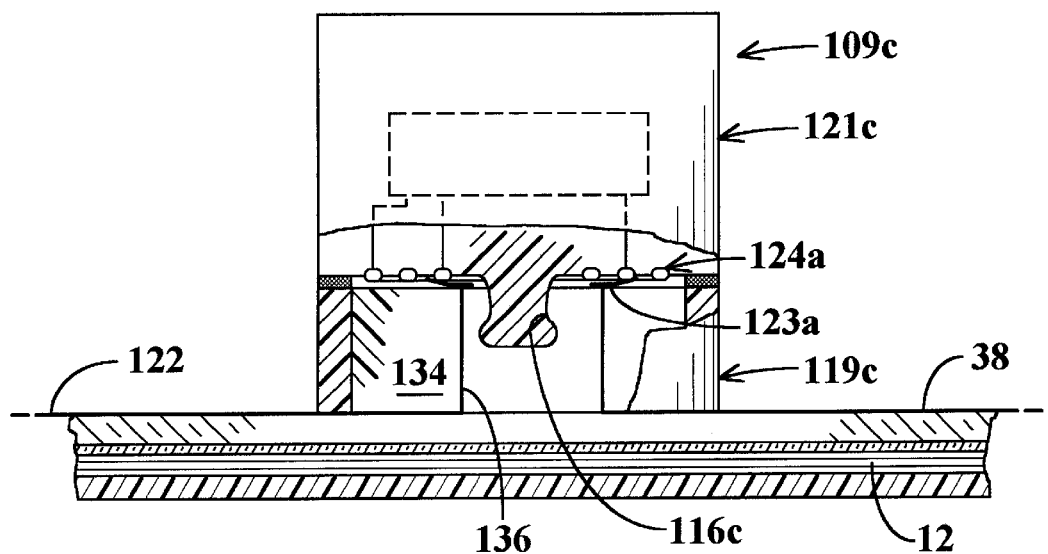
FIG. 34 is a side view, partially in section, of a fourth circuit control device which snap engages at the face of an electronic display screen.

Alternately with reference to FIG. 34, the turnable knob portion 121c of a control device 109c can be snap engaged in an opening 116c in a carrier plate 134 that is contained within a fixed base portion 119c of the control device. The fixed base portion 119c may be secured to the overlay plate 38 or directly to the display: screen 12 with adhesive or by other means. Electrical contacts 123a, 124a may be similar to those previously described with reference to FIGS. 30, and 31 provided that, with reference again to FIG. 34, conductors 136 extend through the carrier plate 134 to connect the contacts with the conductive traces 122 which extend along the overlay plate 38.

FIGS. 35 and 36 depict another example of a rotary knob type of control device 109d having a turnable knob portion 121d engaged on a non-rotating base portion 119d. The base portion 119d is affixed to overlay plate 38 of the display screen 12 by a plurality of the previously described snap engagements 113. In this example there are three such snap engagements 113 which are spaced apart and arranged in a triangular pattern although differing numbers of the snap engagements arranged in differing patterns are also suitable. Use of a plurality of the snap engagements prevents turning of the base portion 119d including in instances where the engagements have a circular cross section and also inhibits slight tilting movement of the control device 109d relative to the display screen 12.

Electrical connections to the control device 109d of this example are provided for by a connector 137 of the zebra strip type. Connectors of this type are a strip of insulative material which may be adhered to the underside of the control device 109d and which have parallel spaced apart bands 138 formed of spongy compressible electrical conductor that compresses against the conductive traces 122d that extend along the overlay plate 38 to connect the control device 109d with external circuits. Connectors 137 of this type provide electrical connections comparable to soldered connections or the like.

For purposes of example the control signal producing circuit 126d of control device 109d is depicted as rotary encoder of the type previously described with reference to FIGS. 18 to 21 but may be of any of the other known types. In this specific example, with reference again to FIGS. 35 and 36, the light sources 93d and the light detectors 92d which view the light sources through an optically coded cylinder 87d are within the base portion 119d of the control device. The coded cylinder 87d extends out of the base portion and is attached to the knob portion 121d of the control device to turn with the knob.

Control devices having a knob which turns on a fixed base typically have some components of the control signal generating means in the base and some which are carried by or within the knob In the above described control device 109d for example, the optically coded cylinder 87d is a component of the knob portion 121d of the device while electronic components of the signal producing means are within the base 119d. It can be advantageous if all signal producing components are components of the base portion as the knob may then have a simple and economical construction. This facilitates replacement of a worn knob or replacement of a knob with another of different size. Referring to FIGS. 37 and 38, this maybe accomplished by providing an intermediate member 139 which is not a component of the knob portion 121e of the control device while being constrained to rotate with the knob portion.

The intermediate member 139 in this example is a disk disposed between the knob portion 121e and base portion 119e and which is preferably attached to the base portion by means which enable rotation of the intermediate by another snap engagement 113e situated the axis of rotation. The control device 119e of this example is similar to the control device 109d of FIGS. 35 and 36 except that, with reference again to FIGS. 37 and 38, the optically coded cylinder 87e is attached to intermediate member 139 rather than to the knob portion 121e of the control device. A diagonally oriented rib projection 141 on the inside surface of knob portion 121e seats in a diagonally oriented groove 142 in intermediate member 139 to constrain the member to rotate with the knob. In a modification of the construction, shown in FIG. 39, the rib and groove are replaced with a pair of projections 143 on the inner surface of the knob portion 121e which are positioned to enter conforming notches 144 in opposite sides of the intermediate member 139.

Figure 39A:
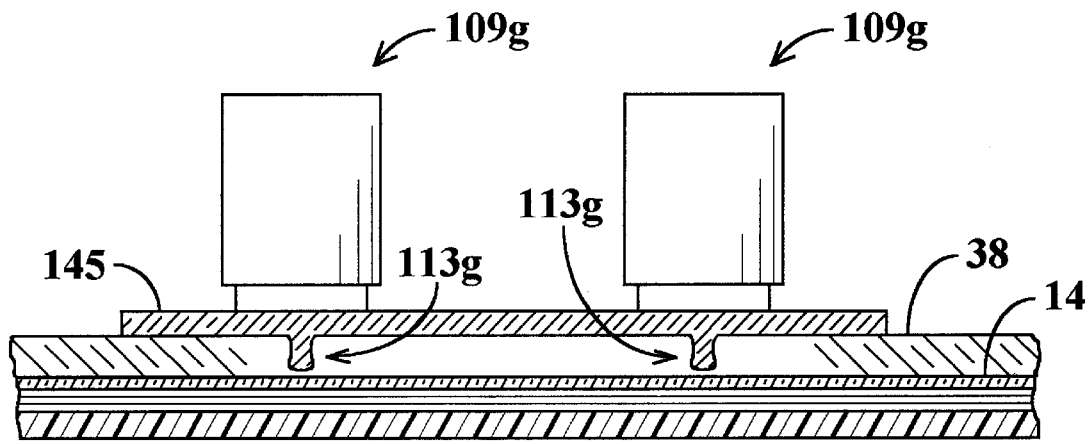
FIG. 39A depicts a portion of an electronic display screen having circuit control devices at the face of the screen and in which the circuit control devices are on a overlay plate which snap engages in place.

The control devices of the previously described snap engaging types snap engage directly to the display screen or to a transparent overlay plate which is disposed against the face of the screen. Such control devices have specialized structural features for enabling the snap engagement. Referring to FIG. 39A, one or more control devices 109g can be indirectly snap engage to the overlay plate 38 or to the display screen itself in which case the devices themselves need not have specialized structural features for effecting the snap engagement. In particular, the bases of the control devices 109g are adhered to or otherwise affixed to a support plate 145 which is disposed against the overlay plate 38 in this example. The support plate 145 has one or more snap engagements 113g of the previously described kind which attach the support plate to the previously described 38 in a releasable manner. In some cases, the support plate may snap engage directly with the transparent outer layer of the display screen 14 in the manner which has been previously described or may engage in holes in the screen itself as has also been previously described. The support plate 145 may be formed at least in part of transparent material to enable viewing of the underlying portion of the display screen 14.

For purposes of example, provisions for snap engaging control devices at the face of a display screen and for establishing electrical connections to the device have been described above with reference to controls of the type having a turnable knob. Referring again to FIGS. 26 and 27, similar snap engagements and electrical connections may be provided with other forms of control device such as switches 108, joysticks 111 and slidable controls or faders 112. The overlay plate 38 or the display screen 14 itself may be provided additional snap engagement openings 116 of either the circular non-circular type to enable repositioning of controls at different locations or installation of additional controls.

Figure 40:
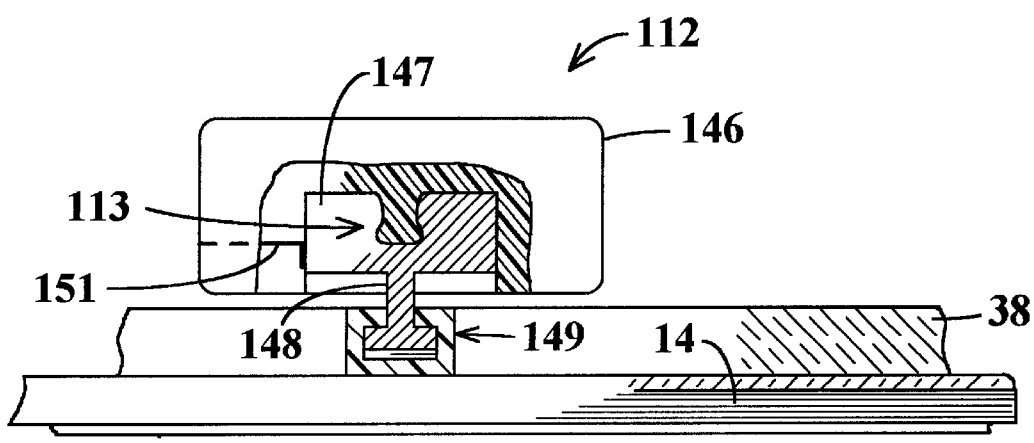
FIG. 40 is a section view corresponding generally to FIG. 3 while illustrating a variation of the control device thereof wherein a slidable cap of a fader type of circuit control device snap engages in place.

It is advantageous if the slidable cap 146 of the fader type of control device 112 can be easily replaced as the cap may wear or the operator may desire to replace it with a different sized cap. Referring to FIG. 40, fader cap 146 replacement is facilitated if it is snap engaged on an enlargement 147 at the top of the post 148 which extends out of the track member 149 of the control device to support the cap. The snap engagement 113 may have a configuration similar to the previously described snap engagements. The cap 146 may contain an electrical conductor 151 which extends from the conductive outer coating of the cap to enlargement 147 if the control is of the touch sensitive type which has been previously described. The fader type control device 112 may otherwise be similar to any of those which have been previously described.

Figure 41:
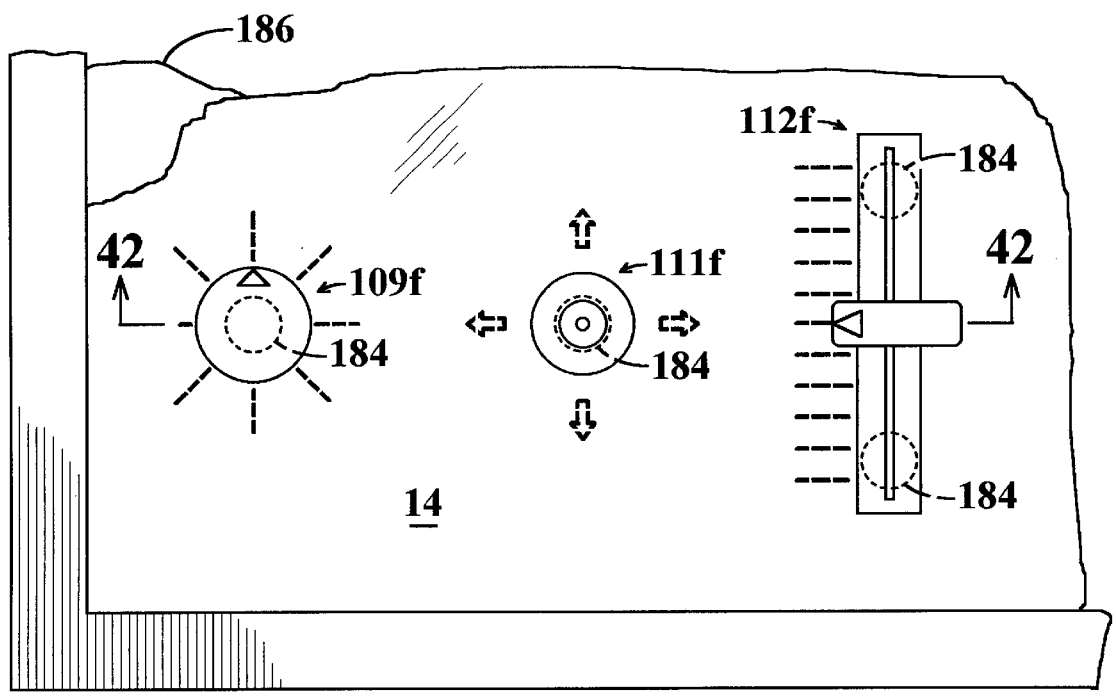
FIG. 41 depicts a portion of an electronic display screen having circuit control devices at the face of the screen which can be moved from one location to another on the screen.
Figure 42:
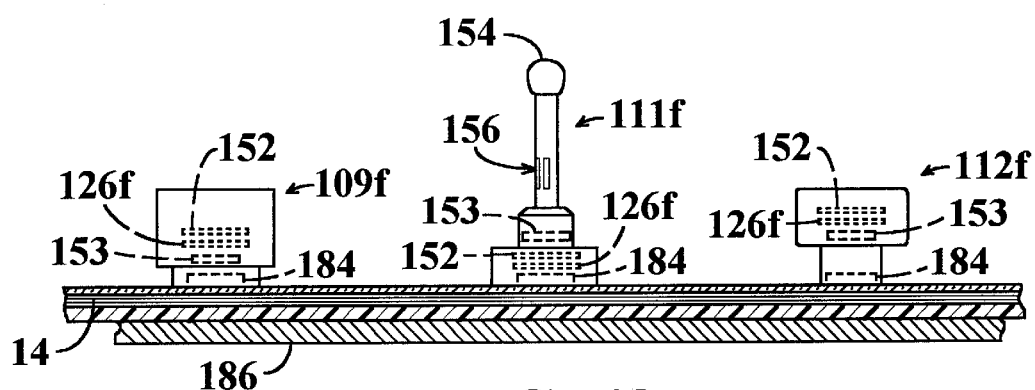
FIG. 42 is a section view taken along line 42—42 of FIG. 41.

Previously described embodiments of the invention require that electrical conductors or a tongue extend in front of the display screen to connect the control devices with off screen circuit components. Referring to FIGS. 41 and 42, the need for such conductors or a tongue can be avoided by transmitting the signals from the control devices in the form of radio frequency signals, modulated infrared signals or ultrasound signals. The control devices such as rotary knob devices 109f, joysticks 111f or sliding cap control devices 112f may be essentially similar to those previously described except that each contains a transmitter circuit 152 and a battery 153 to provide for a self-contained electrical power supply and need not have the external electrical contacts and connections of the previously described embodiments. The internal control signal producing circuits 126 of the control devices may be of any of the previously described forms.

For purposes of example, internal circuitry of the joystick 112f type of broadcasting control device will be described. Internal circuitry of the other types of control device 109f and 112f may be similar except as herein described.

Joystick 112f has a resilient post 154 which is deflected by the operator in a selectable direction to generate a direction identifying control signal. Two strain gauge load cells 156 are bonded to the side of the post 154 to detect the deflections and are of the known type in which electrical resistance changes when the cell is stretched or compressed in a longitudinal direction. The cells 156 extend longitudinally along post 154 and are at locations which are 90° apart with reference to the longitudinal axis of the post. Thus deflection of post 154 in any direction causes resistance changes in cells 156. The pair of resistance values that are exhibited by the two cells in response to deflection of the post 154 in any given direction differs from the pair of values that are exhibited in response to deflection of the post in any other direction. This enables identification of direction of the deflection.

Figure 43:
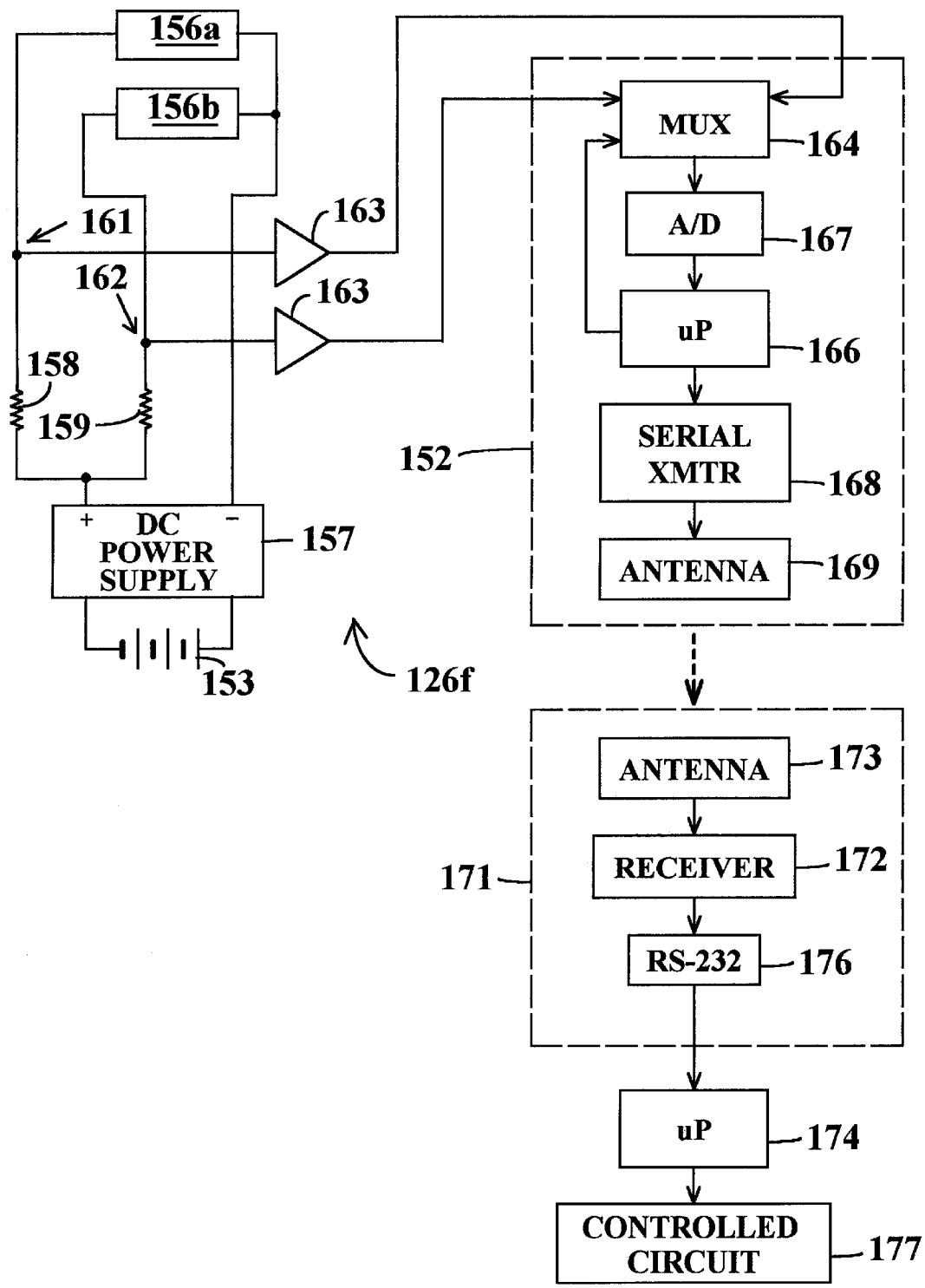
FIG. 43 is a schematic circuit diagram depicting electronic circuit components for the circuit control devices of FIGS. 41 and 42 wherein control signals are transmitted to the controlled apparatus by radio frequency transmission.

Referring to FIG. 43, the internal control signal producing circuit 126f of the joystick control device includes a D.C. power supply 157 energized by the self contained battery 153. A first of the strain gauge load cells 156a is connected across the positive and negative terminals of power supply 157 in series relationship with a first resistor 158. The other load cell 156b is connected across the power supply 157 in series relationship with a second resistor 159. Thus the first load cell 156a and first resistor 158 jointly form a first voltage divider in which the voltage at a circuit junction 161 between the load cell and the resistor changes when the resistance of the load cell changes. The other load cell 156b and second resistor 159 form a second voltage divider having a similar circuit junction 162 at which the voltage changes when the resistance of the other load cell changes. Owing to the previously described different positioning of the two load cells on the joystick, the pair of voltages at the two circuit junctions 161 and 162 during a deflection of the joystick in a particular direction differs from the pair of voltages produced by deflection of the joystick in any other direction. Thus the two voltages enable identification of the direction of deflection of the joystick.

The voltages at circuit junctions 161 and 162 are applied to the signal transmitting circuit 152 through separates ones of a pair of buffer amplifiers 163. The transmitting circuit 152 of this embodiment is similar to that described at column 31, line 53 to column 32, line 16 of U.S. Pat. No. 5,936,613 which is herein incorporated by reference. Transmitting circuit 152 has a multiplexer 164 to which the voltage signals from buffer amplifiers 163 are applied and which is cycled by a microprocessor 166. Multiplexer 164 repetitively transmits the signals to microprocessor 166 through an analogy to digital signal converter 167. Microprocessor 166 delivers the digitized signal values in serial form to a radio transmitter 168. The output of radio transmitter 168 is applied to an antenna 169 which is contained within the control device.

The signals in radio frequency form are transmitted to a receiving circuit 171 which may be located in the marginal region of the display screen of the control device or which may be at some other location within the range of the radio signals. The receiving 171 includes a radio receiver 172 having a receiving antenna 173 and which delivers the received digitized signal values to a signal processing microprocessor 174 through a binary serial interface 176 which is of the RS-232 type in this example. Microprocessor 174 outputs the control signals to the apparatus 177 which is being controlled by the control device. The microprocessor 174 has an internally configured look up table in which the control signal value which is to be outputted in response to each of the differing pairs of strain gauge load cell signal values are stored. Microprocessor programming suitable for this purpose is described the herein before identified U.S. Pat. No. 5,936,613 at column 10, lines 19 to 61 thereof.

Figure 44:
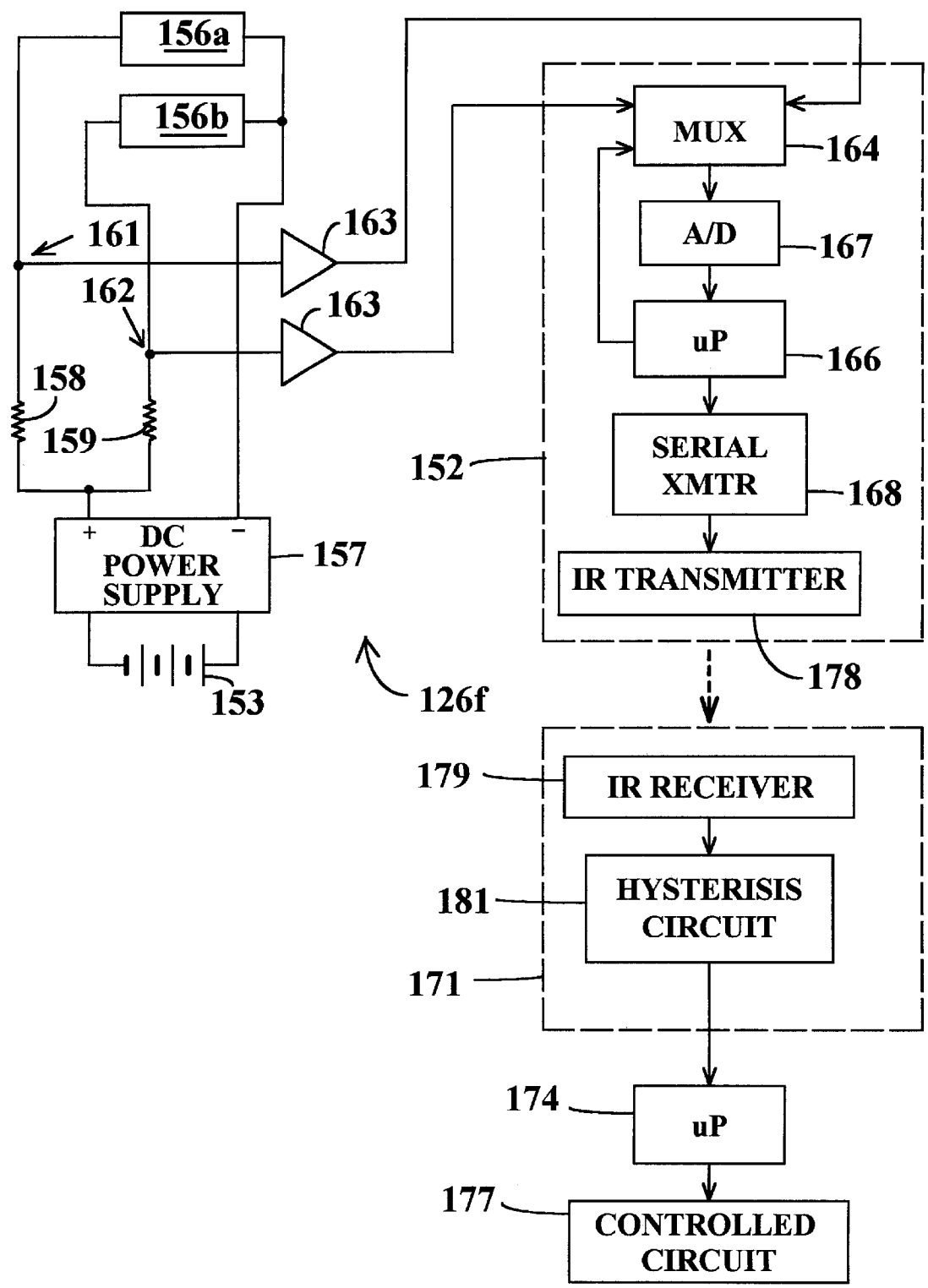
FIG. 44 is a schematic circuit diagram depicting a modification of the electronic circuit components for the circuit control devices of FIGS. 41 and 42 wherein control signals are transmitted to the controlled apparatus by infrared energy.

Referring to FIG. 44 the control device may have a similar electrical circuit when the load cell signal values from buffer amplifiers 163 are transmitted in the form of modulated infrared energy except that the radio transmitter of the transmitting circuit 152 is replaced with an infrared transmitter 178 and the components of the signal receiving circuit 171 are replaced with an infrared receiver 179 and hysterisis circuit 181. Infrared receiver 179 converts the infrared signals back into digital electrical signals and applies them to the signal processing microprocessor 174 through the hysterisis circuit 181.

The electrical circuit may also be similar to that described with reference to FIG. 43 when the signal are transmitted in the form of modulated ultrasound except that with reference to FIG. 45, the radio transmitter and antenna are replaced with an ultrasonic transmitting transducer 182 and the radio receiver and receiving antenna are replaced with an ultrasonic receiving transducer 183 which converts the ultrasonic signals back into digital electrical signals.

Figure 45:
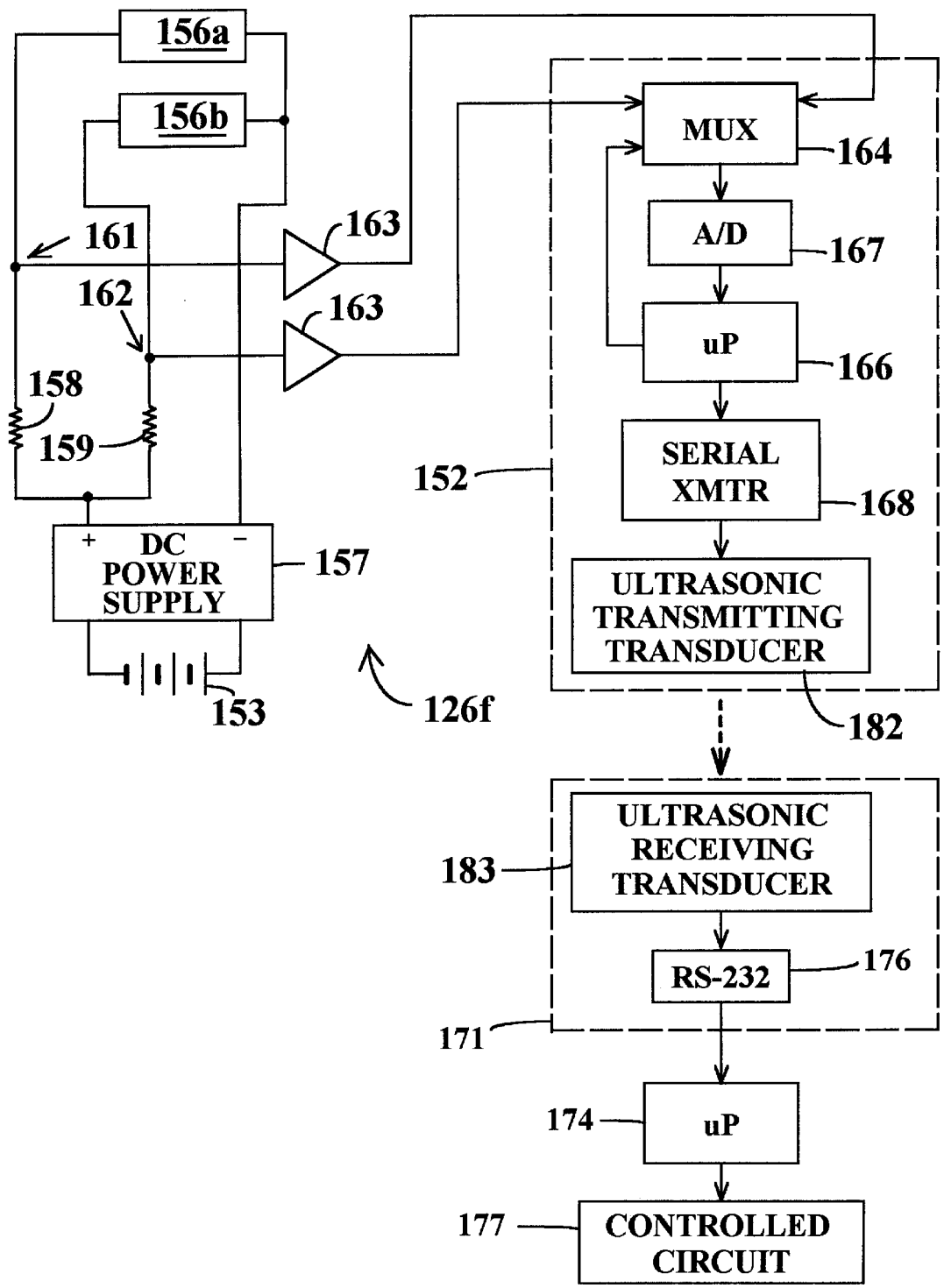
FIG. 45 is a schematic circuit diagram depicting, another modification of the electronic circuit components for the circuit control devices of FIGS. 41 and 42 wherein control signals are transmitted to the controlled apparatus by ultrasound.

Referring jointly to FIGS. 43, 44 and 45, the multiplexer 164 of the transmitting circuit 152 enables the circuit to process two simultaneous input signals each of which originates at a separate one of the strain gauge load cells 156a and 156b. The control signal producing circuits of some other forms of control device produce only a single signal in the form of a varying voltage. Control devices in which the signal is produced by a rotary or a linear potentiometer are examples. Multiplexer 164 is not needed and the signal may be applied directly to analog to digital converter 167 in instances where only a single signal is applied to the transmitting circuit 152. The multiplexer 164 is present when the control signal producing circuit is of a type which produces multi-bit digital signals such as the control device of FIGS. 35 and 36, but in this case the analog to digital converter 167 of FIGS. 43, 44 and 45 is not needed.

Referring again to FIGS. 41 and 42 transmitting of the control signals from the control devices 109f, 111f, 112f by radio frequency, infrared or ultrasound, enables the control devices to be emplaced at any desired location on a display screen 14 which need not necessarily have any special adaptations, such as conductors at the face of the screen, to accommodate to the presence of the control devices. The control devices may be moved from one location on the screen to another. It is preferable in most instances that movable control devices of this kind be subject to some hold down force when they are emplaced at a particular location. For this purpose, in the present example, the control devices 109*f*, 111*f* and 112*f* each have one or more permanent magnets 184 embedded therein. A sheet 186 of ferromagnetic material is disposed against the back of the display screen 14. Thus magnetic attraction acts to resist displacement of a control device from the location at which it is emplaced on the display screen 14 but that can be accomplished by application of sufficient force. Alternately, sheet 186 can be a broad permanent magnet while the elements 184 which are embedded in the control devices are bodies of ferromagnetic material. The sheet 186 can also bean electromagnet in which case lifting and relocating of a control device can be facilitated by temporarily turning off the electromagnet.

While the invention has been described with reference to certain specific embodiments for purposes of example, many modifications and variations are possible and it is not intended to limit the invention except as defined in the following claims.

What is claimed is:

1. A control device for producing control signals for electrical apparatus which control device has a movable member that is slidable along a track and which has control signal producing components which vary the control signal in response to movement of the movable member, said movable member and track being disposed at least in part at the face of an electronic display screen which displays graphics pertinent to the operation of the control device, wherein the improvement comprises:

at least a portion of said control signal producing components being at an off screen location which is away from said face of said display screen and wherein said movable member is linked to said control signal producing components by a tongue which extends longitudinally along said track and is slidable in translation in common with said movable member to variably affect said portion of said control signal producing components at said off screen location.

2. The control device of claim 1 wherein said control signal producing components include a rotary component which is situated at said off screen location and which is turned to vary said control signal and wherein movement of said slidable tongue turns said rotary component.

3. The control device of claim 1 wherein said track includes a track member extending towards an edge of said display screen, said track member having a longitudinal groove extending therealong and wherein said slidable tongue is situated at least partially within said groove and extends past said edge of said display screen to said off screen location at which said control signal producing components are situated.

4. The control device of claim 3 wherein said groove has a wide region situated within the track member and a narrower slot region which extends from the wide region to a front surface of the track member, said slidable tongue being within said wide region of said groove and being wider than said slot region of said groove, said movable member being a cap situated at said front surface of said track member and having a stem which extends into said slot region of said groove and which is joined to said slidable tongue.

5. The control device of claim 3 wherein said track member has a rail situated within said groove and extending therealong, said slidable tongue being engaged on said rail for traveling therealong.

6. The control device of claim 1 wherein said control signal producing components include a signal varying component which varies an electric output signal in response to turning of a turnable shaft, further including means for turning said shaft in response to sliding movement of said slidable tongue.

7. The control device of claim 6 further including an electrical motor coupled to said shaft to turn said shaft, a touch sensing circuit having a touch signal input electrically connected to said movable member through said slidable tongue which touch sensing circuit inactivates said motor in response to touching of said movable member by an operator.

8. The control device of claim 6 wherein said shaft turns about an axis of rotation that is orthogonal to said slidable tongue and wherein said means for turning said shaft includes a rotary ear which is rotatable about said axis of rotation and coupled to said shaft to turn said shaft said slidable tongue having gear teeth which engage gear teeth of said rotary gear to turn said gear in response to sliding movement of said tongue.

9. The control device of claim 6 wherein said shaft turns about a first axis of rotation that is orthogonal to said slidable tongue and wherein said means for turning said shaft includes a rotary gear which is rotatable about said first axis of rotation and coupled to said shaft to turn said shaft, further including an intermediate gear which is rotatable about a second axis of rotation that is perpendicular to said first axis of rotation and which engages said rotary gear to turn said rotary gear, said slidable tongue having gear teeth which engage gear teeth of said intermediate gear to turn said intermediate gear in response to sliding movement of said tongue.

10. The control device of claim 6 and wherein said means for turning said shaft includes a rotary gear which is rotatable about a first axis of rotation that is orthogonal to said tongue and wherein said tongue has gear teeth which engage said rotary gear to turn said rotary gear and wherein said shaft turns about a second axis of rotation that is parallel to said slidable tongue, further including a first bevel gear which turns about said first axis of rotation with said rotary gear and a second bevel gear which is perpendicular to said first bevel gear and engaged therewith which second bevel gear turns said shaft.

11. The control device of claim 1 wherein said control signal producing components include a rotary component which is situated at said off screen location and which is turned to vary said control signal, and wherein said tongue contacts an annular peripheral region of said rotary component to turn said rotary component in response to sliding movement of said tongue, said tongue being formed of flexible material and wherein said tongue is flexed to extend along at least a portion of said annular peripheral region of said rotary component.

12. The control device of claim 11 wherein said tongue extends around at least a 180° segment of said rotary component.

13. The control device of claim 11 further including at least one roller positioned to hold said tongue against said portion of said annular peripheral region of said rotary component.

14. The control device of claim 11 wherein said rotary component has an annular set of gear teeth at said annular peripheral region thereof and said tongue has gear teeth extending therealong which engage said gear teeth of said rotary component.

15. The control device of claim 1 wherein said control signal producing components include a rotary potentiometer having a rotary member which is turned about an axis of rotation by sliding movement of said tongue and which outputs a control signal that varies in response to turning of said rotary member.

16. The control device of claim 1 wherein said control signal producing components include a rotary encoder having a rotary member which is turned about an axis of rotation by sliding movement of said tongue, said rotary member having angular position identifying coding thereon which turns about said axis of rotation with said rotary member, further including at least one coding sensor positioned to read successive areas of said coding as said rotary member turns about said axis of rotation.

17. The control device of claim 16 wherein said rotary member is a cylinder centered on said axis of rotation.

18. The control device of claim 16 wherein said rotary member is a disk centered on said axis of rotation.

19. The control device of claim 16 wherein said coding is defined by areas on said rotary member which have differing optical characteristics and wherein said coding sensor includes a photo-optical device positioned to scan said areas of differing optical characteristics as said rotary member is turned about said axis of rotation.

20. The control device of claim 16 wherein said coding is defined by a plurality of zones on said rotary member which include electrically insulative areas and electrically conductive areas arranged in differing patterns further including a voltage source which applies an electrical voltage to said electrically conductive areas, wherein said coding sensor includes a plurality of electrical contacts each being positioned to contact said electrically insulative areas and electrically conductive areas of a separate one of said zones as said rotary member is turned about said axis of rotation.

21. A control device for producing control signals for electrical apparatus which control device is disposed in front of the image display area of an electronic display screen that displays graphics pertinent to the operation of the control device, wherein the improvement comprises:
said control device having a base fastened to said electronic display by a snap engagement, said snap engagement being selectively releasable to permit attachment and removal of said base and said control device from said display screen.

22. The control device of claim 21 wherein said control device has a knob which is turnable relative to a fixed base and wherein said snap engagement is configured to prevent turning of said base relative to said screen.

23. The control device of claim 21 wherein said control device is a control device of the type having a knob which is turned to vary a control signal.

24. The control device of claim 21 wherein said control device is a control device of the type having a cap which is slid along a linear path to vary a control signal.

25. The control device of claim 21 wherein said control device is a control device of the type having a joystick which is manipulated to vary a control signal.

26. The control device of claim 21 wherein said control device is an electrical switch.

27. The control device of claim 21 wherein said snap engagement engages a support plate with said display screen, said control device being affixed to said support plate.

28. A control device for producing control signals for electrical apparatus which control device is disposed in front of the image display area of an electronic display screen that displays graphics pertinent to the operation of the control device wherein the improvement comprises:
said control device being fastened to said electronic display by a snap engagement,
wherein said electronic display screen has an outermost layer of material at said image display area thereof and wherein said snap engagement includes a protrusion extending from said control device into an opening in said outermost layer, said protrusion having a region which is broader than a region of said opening thereby requiring distortion of at least one of said protrusion and said material of said outermost layer during insertion and withdrawal of said protrusion at said opening.

29. The control device of claim 28 wherein said outermost layer has a plurality of said openings therein enabling selective repositioning of said control device at any of a plurality of locations on said screen.

30. The control device of claim 28 wherein said opening has a circular configuration enabling rotary motion of said protrusion therein.

31. The control device of claim 30 further including a lining encircling said protrusion within said opening, said lining having a coefficient of friction which is lower than the coefficient of friction of a surface which is abutted by said lining.

32. The control device of claim 28 further including a circular resilient guide member attached to said control device in position to be forced against said outermost layer when said protrusion is emplaced in said opening.

33. The control device of claim 28 wherein said control device has first electrical contacts thereon for interconnecting said control device with a circuit which is away from the location of the control device, said first electrical contacts being on a surface of said control device which faces said outermost layer when said control device is snap engaged thereon, further including a plurality second electrical contacts disposed on said outermost layer at locations where said first and second electrical contacts contact each other when said control device is snap engaged on said screen, and a plurality of electrically conductive traces extending along said outermost layer from said second electrical contacts to at least one edge of said image display area for electrical interconnection of said second contacts with said circuit.

34. The control device of claim 28 wherein said control device has a plurality of electrical contacts thereon for interconnecting said control device with a circuit which is away from the location of the control device, said electrical contacts being on a surface of said control device which faces said outermost layer when said control device is snap engaged on said screen and being parallel spaced apart bands of resilient electrically conductive material, further including a plurality of electrically conductive traces extending along said outermost layer to at least one edge of said image display area, said conductive traces having ends positioned to be contacted by said electrical contacts when said control device is snap engaged on said screen.

35. The control device of claim 28 wherein said outermost layer has a plurality of said openings therein and wherein said control device has a plurality of said protrusions each of which extends into a separate one of said openings.

36. The control device of claim 28 wherein said outermost layer of material is a transparent plate overlaid on said display screen at said image display area thereof.

37. The control device of claim 28 wherein said electronic display screen is a flat panel display having a transparent cover layer, said outermost layer being said transparent cover layer of said screen.

38. The control device of claim 37 wherein said opening extends into said flat panel display at said image display area thereof.

39. A control device for an electrical circuit which control device has a knob which is turnable to any of a plurality of different angular orientations to chance an electrical condition in the circuit, wherein the improvement comprises:

said knob being disposed in front of an electronic image display device which has an image display area at which changeable images are displayed, and wherein at least a portion of said knob is at a location which overlays the image display area of said image display device, a control signal producing circuit situated at said location and which produces an electrical signal that varies in response to turning of said knob, an infrared transmitter disposed in said control device at said location in electrical connection with said control signal producing circuit and which outputs said control signal in the form of modulated infrared energy, a control signal receiving circuit situated away from said image display area of said image display device which control signal receiving circuit includes an infrared receiver for receiving wireless transmission of said control signal from said transmitter and converting the infrared signal back into an electrical signal;

said image display device having a marginal region which adjoins said image display area, said infrared receiver being situated within said marginal region of said image display device.

40. A control device for an electrical circuit which control device has a knob which is turnable to any of a plurality of different angular orientations to change an electrical condition in the circuit, wherein the improvement comprises:

said knob being disposed in front of an electronic image display device which has an image display area at which changeable images are displayed, and wherein at least a portion of said knob is at a location which overlays the image display area of said image display device, a control signal producing circuit situated at said location and which produces an electrical signal that varies in response to turning of said knob, an ultrasonic transmitter disposed in said control device at said location in electrical connection with said control signal producing circuit and which outputs said control signal in ultrasonic form, a control signal receiving circuit situated away from said image display area of said image display device which control signal receiving circuit includes an ultrasonic receiver for receiving wireless transmission of said control signal from said transmitter and converting the ultrasonic signal back into as electrical signal.

41. The control device of claim 40 wherein said image display device has a marginal region which adjoins said image display area, said ultrasonic receiver being situated within said marginal region of said image display device.

42. A control device for an electrical circuit which control device has a cap which is slidable along a track to any of a plurality of different positions to change an electrical condition in the circuit, wherein the improvement comprises:

said cap and track being disposed in front of an electronic image display device which has an image display area at which changeable images are displayed, and wherein at least portions of said cap and track overlay the image display area of said image display device, further including a signal producing circuit disposed within at least one of said cap and said track and which produces an electrical signal that varies in response to movement of said cap alone said track, a signal transmitter disposed in said control device and being in electrical connection with said signal producing circuit and which transmits said signal wirelessly outwardly from said control device to a signal receiving circuit situated away from said image display area of said image display device.

43. The control device of claim 42 wherein said image display device has a marginal region which adjoins said image display area, said signal receiving circuit being situated within said marginal region of said image display device.

44. The control device of claim 42 wherein said signal transmitter is a radio transmitter and said signal receiving circuit is a radio receiver.

45. The control device of claim 42 wherein said signal transmitter is an infrared transmitter and said signal receiving circuit is an infrared receiver.

46. The control device of claim 42 wherein said signal transmitter is an ultrasound transmitter and said signal receiving circuit is an ultrasound receiver.

47. A control device for an electrical circuit which control device is a joystick having a member which is deflectable in lateral directions to change an electrical condition in the circuit, wherein the improvement comprises:

said joystick being disposed in front of an electronic image display device which has an image display area at which changeable images are displayed, and wherein at least portions of said joystick overlay the image display area of said image display device, and a signal producing circuit disposed within said joystick and which produces an electrical signal that varies in response to deflections of said member a signal transmitter disposed in said joystick in electrical connection with said signal producing circuit and which transmits said signal wirelessly outwardly from said joystick to a signal receiving circuit situated away from said image display area of said image display device.

48. The control device of claim 47 wherein said image display device has a marginal region which adjoins said image display area, said signal receiving circuit being situated within said marginal region of said image display device.

49. The control device of claim 47 wherein said signal transmitter is a radio transmitter and said signal receiving circuit is a radio receiver.

50. The control device of claim 47 wherein said signal transmitter is an infrared transmitter and said signal receiving circuit is an infrared receiver.

51. The control device of claim 47 wherein said signal transmitter is an ultrasound transmitter and said signal receiving circuit is an ultrasound receiver.

52. A control device for producing control signals for electrical apparatus which control device has a movable member that is slidable along a track and which has control signal producing components which vary the control signal in response to movement of the movable member said movable member and track being disposed at least in part at the face of an electronic display screen which displays graphics pertinent to the operation of the control device, wherein the improvement comprises:

at least a portion of said control signal producing components being at an off screen location which is away from said face of said display screen and wherein said movable member is linked to said control signal producing components by a slidable tongue which extends along said track from said movable member to said off screen location, wherein said control signal producing components include a rotary gear which is situated at said off screen location and electronic components which vary said control signal in response to turning of said rotary gear, said slidable tongue having a linear set of gear teeth extending along at least one surface of the tongue and which engage a circular set of gear teeth on said rotary gear.

53. The control device of claim 52 wherein said rotary ear turns about an axis of rotation and wherein said circular set of gear teeth are on a cylindrical surface of said rotary gear that is coaxial with said axis of rotation and said linear set of gear teeth are on an under surface of said slidable tongue which faces said cylindrical surface.

54. The control device of claim 52 wherein said rotary gear has a circular groove in a circular outer surface of the gear which groove is bounded by circular flange regions of the ear at each side of the groove, said rotary gear having a circular set of gear teeth on at least one of said flange regions of the gear and said slidable tongue having a linear set of gear teeth extending along at least one side surface of the tongue.

55. A control device for producing control signals for electrical apparatus which control device has a movable member that is slidable along a track and which has control signal producing components which vary the control signal in response to movement of the movable member, said movable member and track being disposed at least in part at the face of an electronic display screen which displays graphics pertinent to the operation of the control device, wherein the improvement comprises:

at least a portion of said control signal producing components being at an off screen location which is away from said face of said display screen and wherein said movable member is linked to said control signal producing components by a slidable tongue which extends along said track from said movable member to said off screen location, wherein said control signal producing components include a rotary component which is situated at said off screen location and which is turned to vary said control signal, and wherein said tongue contacts an annular peripheral region of said rotary component to turn said rotary component in response to sliding movement of said tongue, said tongue being formed of flexible material and wherein said tongue is flexed to extend along at least a portion of said annular peripheral region of said rotary component, further including a tongue guide having an arcuate surface positioned to hold said tongue against said portion of said annular peripheral region of said rotary component.

56. A control device for producing control signals for electrical apparatus which control device has a movable member that is slidable alone a track and which has control signal producing components which vary the control signal in response to movement of the movable member, said movable member and track being disposed at least in part at the face of an electronic display screen which displays graphics pertinent to the operation of the control device, wherein the improvement comprises:

at least a portion of said control signal producing components being at an off screen location which is away from said face of said display screen and wherein said movable member is linked to said control signal producing components by a slidable tongue which extends along said track from said movable member to said off screen location, wherein said control signal producing components include a rotary component which is situated at said off screen location and which is turned to vary said control signal and wherein movement of said slidable tongue turns said rotary component, wherein said control device has first electrical contacts thereon for interconnecting said control device with a circuit which is away from the location of the control device, said first electrical contacts being on a surface of said control device which faces said outermost layer when said control device is snap engaged thereon, further including a plurality of second electrical contacts disposed on said outermost layer at locations where said first and second electrical contacts contact each other when said control device is snap engaged on said screen, and a plurality of electrically conductive traces extending along said outermost layer from said second electrical contacts to at least one edge of said image display area for electrical interconnection of said second contacts with said circuit.

57. The control device of claim 56 wherein said control device is turnable about an axis of rotation that extends at right angles to said image display area, said first electrical contacts being circular bands of electrically conductive material which are of differing diameters and which are centered on said axis of rotation.

* * * * *